(12) United States Patent
Masuda

(10) Patent No.: US 6,281,824 B1
(45) Date of Patent: Aug. 28, 2001

(54) DIGITAL TO ANALOG CONVERTER USING CONSTANT CURRENT SOURCES

(75) Inventor: Toshihiko Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/416,087

(22) Filed: Oct. 12, 1999

Related U.S. Application Data

(62) Division of application No. 09/040,368, filed on Mar. 18, 1998.

(30) Foreign Application Priority Data

Mar. 28, 1997 (JP) ............................................... P09-078035

(51) Int. Cl.$^7$ ............................ H03M 1/66; H03M 13/00
(52) U.S. Cl. .............................................. 341/144; 341/94
(58) Field of Search ................................. 341/144, 120, 341/118, 119, 148, 94

(56) References Cited

U.S. PATENT DOCUMENTS 5,870,043 * 2/1999 Hiromi .................................. 341/120
5,949,362 * 9/1999 Tesch et al. .......................... 341/144
6,118,398 * 9/2000 Fisher et al. ......................... 341/144

* cited by examiner

*Primary Examiner*—Patrick Wamsley
(74) *Attorney, Agent, or Firm*—Jay H. Maioli

(57) ABSTRACT

A D/A converter of a multibit type has improved performance by reducing dispersion of the electric currents of plural electric current sources as much as possible in which the D/A converter has a constant electric current source (10) constructed by $2^N$ (N=2, 3, - - - and here, N=16) constant electric current sources having constant electric current values equal to each other; selectors (7, 8) for selecting Di constant electric current sources according to input data Di {here, Di=0, 1, 2, 3, - - - , $(2^N-1)$} having N-bits in input word length so as to use these $2^N$ constant electric current sources one by one until a sum of values of one input data or continuous plural input data among these $2^N$ constant electric current sources exceeds $2^N$; and an electric current adder (9) for adding each of the constant electric currents from the Di constant electric current sources selected by the selectors to each other.

3 Claims, 13 Drawing Sheets

FIG. 7

Table 1

| Constant Current in | Current Value | Constant Current in | Current Value |
|---|---|---|---|
| $i_1$ | 0.993862 | $i_9$ | 1.000528 |
| $i_2$ | 0.995644 | $i_{10}$ | 1.000792 |
| $i_3$ | 0.996205 | $i_{11}$ | 1.001617 |
| $i_4$ | 0.997426 | $i_{12}$ | 1.001914 |
| $i_5$ | 0.9977725 | $i_{13}$ | 1.002937 |
| $i_6$ | 0.998680 | $i_{14}$ | 1.003333 |
| $i_7$ | 0.998944 | $i_{15}$ | 1.005049 |
| $i_8$ | 0.999736 | $i_{16}$ | 1.00990 |

FIG. 8 Table2

| Constant Current in | Switching Address SWn | Constant Current in | Switching Address SWn |
|---|---|---|---|
| $i_1$ | $SW_1$ | $i_9$ | $SW_9$ |
| $i_2$ | $SW_2$ | $i_{10}$ | $SW_{10}$ |
| $i_3$ | $SW_3$ | $i_{11}$ | $SW_{11}$ |
| $i_4$ | $SW_4$ | $i_{12}$ | $SW_{12}$ |
| $i_5$ | $SW_5$ | $i_{13}$ | $SW_{13}$ |
| $i_6$ | $SW_6$ | $i_{14}$ | $SW_3$ |
| $i_7$ | $SW_7$ | $i_{15}$ | $SW_{15}$ |
| $i_8$ | $SW_8$ | $i_{16}$ | $SW_{16}$ |

FIG. 9 Table3

| Constant Current in | Switching Address SWn | Constant Current in | Switching Address SWn |
|---|---|---|---|
| $i_1$ | $SW_1$ | $i_5$ | $SW_9$ |
| $i_{16}$ | $SW_2$ | $i_{12}$ | $SW_{10}$ |
| $i_2$ | $SW_3$ | $i_6$ | $SW_{11}$ |
| $i_{15}$ | $SW_4$ | $i_{11}$ | $SW_{12}$ |
| $i_3$ | $SW_5$ | $i_7$ | $SW_{13}$ |
| $i_{14}$ | $SW_6$ | $i_{10}$ | $SW_3$ |
| $i_4$ | $SW_7$ | $i_8$ | $SW_{15}$ |
| $i_{13}$ | $SW_8$ | $i_9$ | $SW_{16}$ |

Simulation 1

Simulation 2

Simulation 3

Simulation 4

Simulation 5

Simulation 6

Simulation 7

Simulation 8

Simulation 9

Simulation 10

Simulation 11

DIGITAL TO ANALOG CONVERTER USING CONSTANT CURRENT SOURCES

This application is a division of Ser. No. 09/040,368 filed Mar. 18, 1998.

BACKGROUND OF THE INVENTION

The present invention relates to a D/A converter of a multibit type.

A D/A converter of a 1-bit type is often adopted in D/A converters used in a digital audio device such as a CD player, etc. when a high accuracy equal to or greater than 16 bits is required. The reasons for this are as follows. The D/A converter of the 1-bit type is constructed by one constant electric current source and one electric current switch. Accordingly, the D/A converter of the 1-bit type has advantages in that no nonlinearity is caused in principle by dispersion of mutual electric current values of plural constant electric current sources as a defect of the D/A converter of a multibit type and no noise (glitch) in a transient area is caused in principle by a shift in on-off timing of plural electric current switches.

The D/A converter of the 1-bit type will next be explained with reference to FIG. 1. A digital audio signal having an FS (Hz) in sampling frequency and 16 bits in word length is supplied to a digital low pass filter section 2 having an audible band (0 to 20 kHz) as a passing band through an input terminal 1. In the digital low pass filter section 2, the sampling frequency is upsampled 8 times and a digital audio signal having this upsampled sampling frequency is outputted therefrom. This digital audio signal as an output of the digital low pass filter section 2 is supplied to a linear interpolating section 3 and the sampling frequency is further upsampled 8 times and a digital audio signal having 64FS (Hz) in sampling frequency is outputted therefrom. A word length of the digital audio signal outputted from this linear interpolating section 3 is constructed by 20 bits by a calculation of the linear interpolating section 3 so that this word length is longer by 4 bits than the input word length of 16 bits.

The digital audio signal outputted from the linear interpolating section 3 is supplied to a noise shaper section (Δ-Σ modulator) 4 so that this digital audio signal is quantized to 4 bits. In this noise shaper section 4, a low frequency band component of quantizing noises caused in the quantization of the input digital audio signal of 20 bits to 4 bits is shifted to a high frequency band and a dynamic range in the audible band (0 to 20 kHz) is secured.

The digital audio signal outputted from the noise shaper section 4 and having the 64FS (Hz) in sampling frequency and quantized to 4 bits is supplied to a PWM (pulse width modulation) pulse converting section 5. In the PWM pulse converting section 5, pulse width modulation of this digital audio signal is performed and the pulse width modulated audio signal is outputted to an output terminal 6. This PWM pulse converting section 5 is constructed by one constant electric current source and one electric current switch. In the PWM pulse converting section 5, frequency resolution of 64FS(Hz)×16=1024FS(Hz), i.e., time axis resolution of {1/1024FS}(sec) is required to represent sixteen pulse widths according to inputted 4-bit data in one period, i.e., {1/(64FS)}(sec).

For example, the sampling frequency FS of a digital audio signal recorded on a CD (compact disk) is set to 44.1(kHz). Accordingly, a clock signal of 64FS(Hz)×16=1024FS(Hz)= 45.1584(MHz) is required and time resolution of a very high accuracy of (1/1024FS)=22.14(n sec) is required to D/A-convert the digital audio-signal.

In the conventional D/A converter of the 1-bit type shown in FIG. 1, the number of bits of the output digital audio signal of the noise shaper section 4 is set to 4 bits, but is generally set to approximately range from 1 to 5 bits. Output word lengths of the filter section 2 and the linear interpolating section 3 are each set to 8 bits, but are generally set to approximately range from 16 to 24 bits.

For example, such a D/A converter of the 1-bit type shown in FIG. 1 is a D/A converter having a high accuracy equal to or greater than 16 bits, but the frequency of a used clock signal is a very high frequency approximately ranging from 20 to 50 MHz and this converter has a high sensitivity with respect to a time axis. Therefore, when such a D/A converter is mounted on a print substrate, attention must be sufficiently paid in wiring of a line for transmitting the clock signal, etc. so as to minimize clock jitter. Further, since the frequency of the used clock signal is very high, considerably severe measures for unnecessary radiation are required. Therefore, a problem also exists in that cost is increased by adding parts for these measures, etc.

It is strongly required to reduce the frequency of the used clock signal in comparison with the conventional case with respect to the D/A converter mounted on an electronic device at low cost, especially, the D/A converter of an-electric current type and a D/A converter mounted on an amplifier for an audio/video corresponding to a multichannel source such as AC-3, etc. with respect to a reproducing device of a DVD (digital video disk) recently attracting public attention.

When an output bit length of PWM pulse data generated in the noise shaper section 4 is set to N (bits) and its calculating speed is set to Fop(Hz), a frequency Fmck1(Hz) of the clock signal used in the D/A converter of the 1-bit type is represented by the following formula (1).

$$Fmck1 = 2^N \times Fop \qquad (1)$$

It should be understood from this formula (1) that the output bit length N of the PWM pulse data generated from the noise shaper section 4 must be shortened or the calculating speed Fop of the noise shaper section 4 must be reduced to reduce the frequency Fmck1 of the clock signal.

However, the dynamic range is reduced by 6 dB every time the output bit length N of the PWM pulse data of the noise shaper section 4 is shortened by 1 bit. For example, when the noise shaper section 4 is constructed in a third order, the dynamic range is reduced by 21 dB every time the calculating speed is reduced to ½. Further, when the output bit length N is shortened, quantizing noises are increased. Accordingly, there is a fear that no stability of a system of the noise shaper section 4 can be compensated. Therefore, it is necessary to reduce a gain of input data in accordance with the increase in quantizing noises, and the dynamic range is really reduced greatly from the above 6 dB. Accordingly, it is impossible to shorten the output bit length N of the PWM pulse data. Further, no frequency of the clock signal used in the D/A converter of the 1-bit type can be generally reduced from the above about 20 to 50 (MHz).

Therefore, the D/A converter of a multibit type capable of reducing the frequency of the used clock signal is indispensable. The frequency Fmck2(Hz) of a clock signal used in the D/A converter of the multibit type is represented by the following formula (2) irrespective of the output bit length N of the PWM pulse data generated from the noise shaper section to represent level information in an amplitude direction.

$$Fmck2=Fop=Fmck1/2^N \quad (2)$$

As mentioned above, in the D/A converter of the multibit type, a PWM pulse converting section must be constructed by plural constant electric current sources and plural electric current switches respectively corresponding to these constant electric current sources. Accordingly, a problem exists in that performance of the D/A converter is deteriorated by dispersion of electric currents of the plural constant electric current sources and dispersion of switching timings of the plural electric current switches. Therefore, when the D/A converter of the multibit type is adopted, it is necessary to reduce the dispersion of the electric currents of the plural constant electric current sources as much as possible and reduce an influence of glitches generated by the dispersion of the switching timings of the plural electric current switches as much as possible.

SUMMARY OF THE INVENTION

In view of such aspects, an object of the present invention is to provide a D/A converter of a multibit type for improving its performance by reducing dispersion of the electric currents of plural electric current sources as much as possible.

Another object of the present invention is to provide a D/A converter of a multibit type for improving its performance by reducing dispersion of the electric currents of plural electric current sources as much as possible, and reducing an influence of glitches caused by dispersion of the switching timings of plural electric current switches corresponding to the plural electric current sources as much as possible.

According to an aspect of the present invention, a D/A converter includes $2^N$ (here, N=2, 3, - - - ) constant electric current sources having constant electric current values equal to each other; a selecting means for selecting Di constant electric current sources according to input data Di {here, Di=0, 1, 2, 3, - - - , $(2^N-1)$} having an N-bit input word length so as to use these $2^N$ constant electric current sources one by one until a sum of values of one input data or continuous plural input data among these $2^N$ constant electric current sources exceeds $2^N$; and an electric current adding means for adding constant electric currents from the Di constant electric current sources selected by the selecting means to each other.

In accordance with the present invention, the $2^N$ (here, N=2, 3, - - - ) constant electric current sources have constant electric current values equal to each other, and the selecting means selects the Di constant electric current sources according to input data Di {here, Di=0, 1, 2, 3, - - - , $(2^N-1)$} having an N-bit input word length so as to use these $2^N$ constant electric current sources one by one until a sum of values of one input data or continuous plural input data among these $2^N$ constant electric current sources exceeds $2^N$. Constant electric currents from these selected Di constant electric current sources are added to each other by the electric current adding means so that a D/A converting output is obtained.

BRIEF DESCRIPTION OF THE DRAWING

FIG. 7 is a table showing a constant electric current source model;

FIG. 8 is a table showing the correspondence of constant electric currents and switching addresses;

FIG. 9 is a table showing the correspondence of constant electric currents and switching addresses;

DETAILED DESCRIPTION OF THE PREFERRED EMBODIMENT

Figure 1:
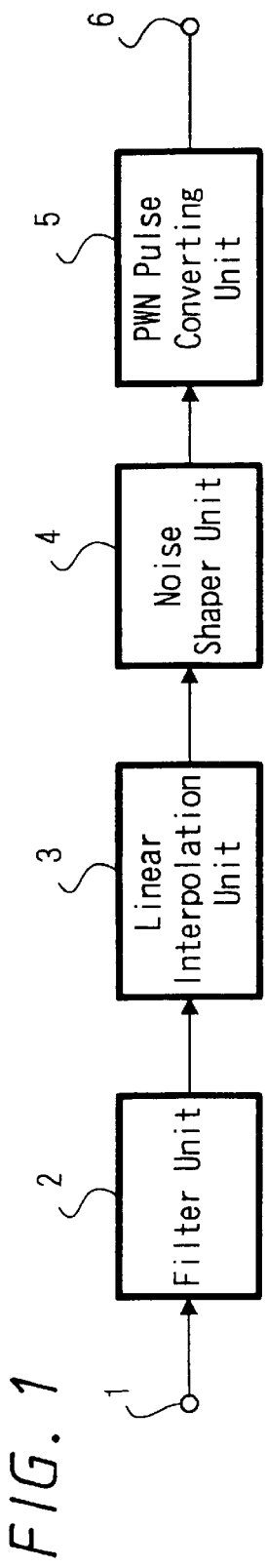
FIG. 1 is a block diagram showing a D/A converter of a 1-bit type.

An embodiment of the present invention will next be described in detail with reference to FIGS. 2 to 6. The entire construction of a D/A converter of a multibit according to the embodiment will first be explained with reference to FIG. 1. For example, a digital audio signal having an FS (Hz) in sampling frequency and 16 bits in word length is supplied to a digital low pass filter section 2 having an audible band (0 to 20 kHz) as a passing band through an input terminal 1. In the digital low pass filter section 2, for example, the sampling frequency is upsampled 8 times and this upsampled digital audio signal is outputted therefrom. The digital audio signal as an output of the digital low pass filter section 2 is supplied to a linear interpolating section 3. For example, in the linear interpolating section 3, the sampling frequency is further upsampled 8 times and a digital audio signal having a 64FS (Hz) in sampling frequency is outputted. A word length of the digital audio signal outputted from the linear interpolating section 3 is constructed by 20 bits by a calculation of the linear interpolating section 3 and is longer by 4 bits than the input word length of 16 bits.

The digital audio signal outputted from the linear interpolating section 3 is supplied to a noise shaper section (Δ-Σ modulator) 4 so that this digital audio signal is quantized to e.g., 4 bits. In this noise shaper section 4, a low frequency band component of quantizing noises caused in the quantization of the input digital audio signal of 20 bits to 4 bits is shifted to a high frequency band, and a dynamic range in the audible band (0 to 20 kHz) is secured.

The digital audio signal outputted from the noise shaper section 4 and having the 64FS (Hz) in sampling frequency and quantized to 4 bits is supplied to a PWM (pulse width modulation) pulse converting section. In the PWM pulse converting section, pulse width modulation of this digital audio signal is performed. The construction of this pulse width modulating section will next be explained.

The digital audio signal outputted from the noise shaper section 4 and having the 64FS (Hz) in sampling frequency and quantized to 4 bits is supplied to a 4-bit data/parallel 16-line electric current switch data converting circuit 7. This "16" is one example and an arbitrary number may be used instead of 16 if this arbitrary number is an integer times the number of bits of input data to this converting circuit 7 when this integer is equal to two or more.

This converting circuit 7 determines one constant electric current source selected from a parallel 16-line electric current source (constant electric current source) 10 described later. The converting circuit 7 further generates sixteen switching signals for controlling the operation of a parallel 16-line electric current source (constant electric current source) ECL (emitter coupling logic) switching circuit 8 described later.

In the parallel 16-line electric current source ECL switching circuit 8, an electric current output according to input data is outputted as a pair of differential output electric currents $i_+$, $i_-$ by the switching signals from the converting circuit 7. These differential output electric currents $i_+$, $i_-$ include a glitch caused by nonconformity of on/off timings of sixteen switching circuits constituting the switching circuit 8. Therefore, an including portion of the glitch is removed from the differential electric currents $i_+$, $i_-$ by a deglitcher circuit 9. Deglitch signals DGL1, DGL2 from a deglitch signal generating circuit 9A are supplied to this deglitcher circuit 9. Electric current outputs IOUT(+), IOUT(−) removing the glitch therefrom are obtained at a pair of output terminals 11, 12 on an output side of the deglitcher circuit 9.

When the switching signals are generated by the converting circuit 7, a reduction in performance of the D/A converter caused by mutual dispersion of sixteen constant electric current sources constituting the electric current source 10 is set to be minimized as described later.

Figure 2:
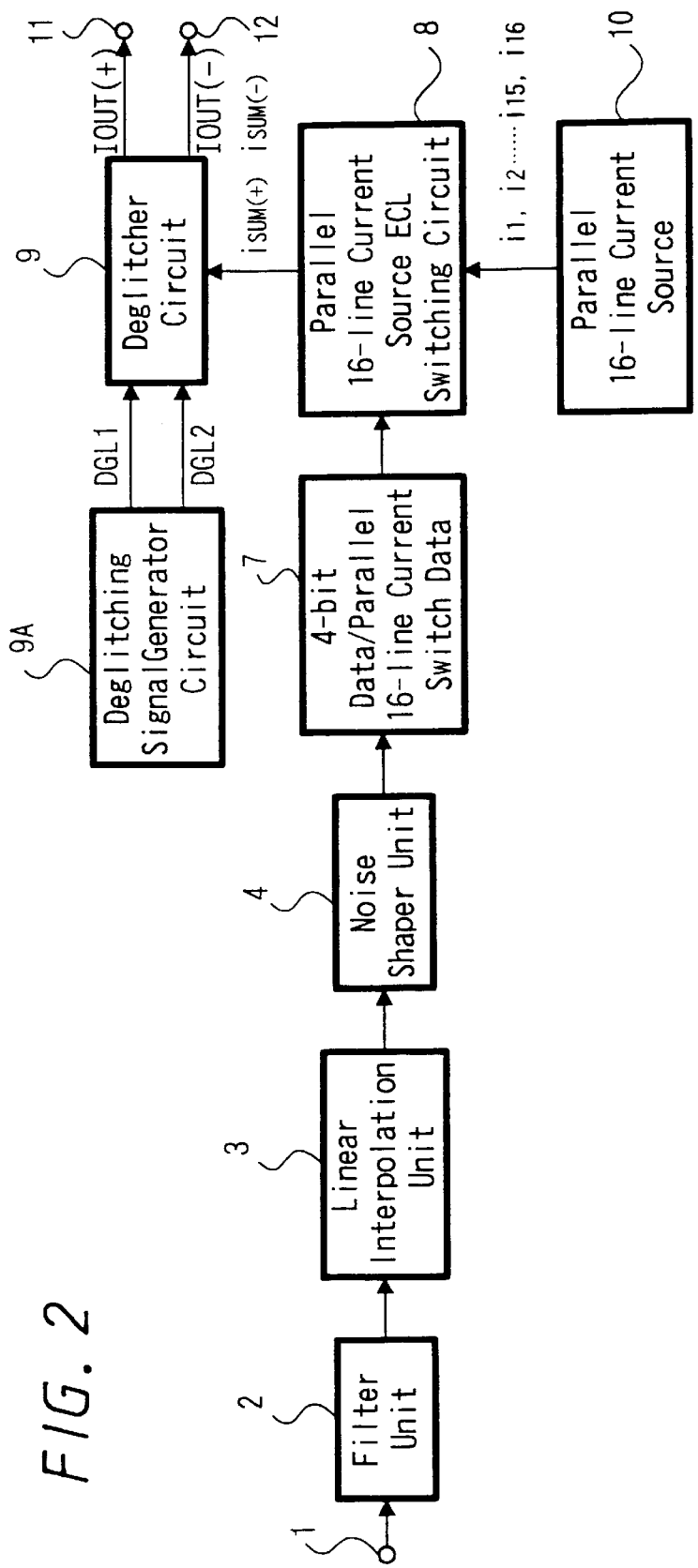
FIG. 2 is a block diagram showing a D/A converter according to an embodiment of the present invention.

The concrete constructions of the circuits 8, 9 and the electric current source 10 in FIG. 2 will next be explained with reference to FIG. 3. The electric current source 10 is constructed by $2^4=16$ constant electric current sources $10_1$, $10_2$, - - - , $10_{15}$, $10_{16}$ respectively having constant electric currents $i_1$, $i_2$, - - - , $i_{15}$, $i_{16}$. One ends of these sixteen constant electric current sources are respectively connected to reference potential points $13_1$, $13_2$, - - - , $13_{15}$, $13_{16}$.

The switching circuit 8 is constructed by sixteen switching circuits $8_1$, $8_2$, - - - , $8_{15}$, $8_{16}$. These switching circuits $8_1$, $8_2$, - - - , $8_{15}$, $8_{16}$ are respectively constructed by pairs of differential transistors (NPN-type transistors) $Q_{11}$, $Q_{12}$; $Q_{21}$, $Q_{22}$; - - - ; $Q_{151}$, $Q_{152}$; $Q_{161}$, $Q_{162}$. Emitters of these transistors $Q_{11}$, $Q_{12}$; $Q_{21}$, $Q_{22}$; - - - ; $Q_{151}$, $Q_{152}$; $Q_{161}$, $Q_{162}$ are respectively connected to the other terminals of the constant electric current sources $10_1$, $10_2$, - - - , $10_{15}$, $10_{16}$. Switching signals $SW_{11}$, $SW_{12}$; $SW_{21}$, $SW_{22}$; - - - ; $SW_{151}$, $SW_{152}$; $SW_{161}$, $SW_{162}$ of normal and reverse phases generated by the converting circuit 7 are respectively supplied to bases of these transistors. These transistors are controlled such that, when ones of these pairs of transistors are turning-on, the other transistors are turning-off. Therefore, constant electric currents $i_1$, $i_2$, - - - , $i_{15}$, $i_{16}$ are outputted from the switching circuits $8_1$, $8_2$, - - - , $8_{15}$, $8_{16}$ at any time.

The deglitcher circuit 9 is constructed by a pair of ECL switching circuits 9a, 9b respectively having pairs of differential transistors (NPN-type transistors) $Q_{a1}$, $Q_{a2}$; $Q_{b1}$, $Q_{b2}$. Ones of these differential transistors (NPN-type transistors) $Q_{a1}$, $Q_{a2}$; $Q_{b1}$, $Q_{b2}$ are turned on and the others are turned off by the deglitch signals (switching signals) DGL1, DGL2 of the normal and reverse phases generated from the deglitch signal generating circuit 9A and supplied to bases of these differential transistors. Collectors of the one transistors $Q_{11}$, $Q_{21}$, - - - , $Q_{151}$, $Q_{161}$ of the switching circuits $8_1$, $8_2$, - - - , $8_{15}$, $8_{16}$ are respectively connected to the emitters of the pair of differential transistors-$Q_{a1}$, $Q_{a2}$ constituting the switching circuit $9a$ so that an electric current $i_{SUM(+)}$ flows through one of the differential transistors $Q_{a1}$, $Q_{a2}$ as a pair. The collector of the transistor $Q_{a1}$ is connected to an output terminal 11 for outputting the electric current $i_{OUT(+)}$.

Collectors of the other transistors $Q_{12}$, $Q_{22}$, - - - , $Q_{152}$, $Q_{162}$ of the switching circuits $8_1$, $8_2$, - - - , $8_{15}$, $8_{16}$ are respectively connected to emitters of the pair of differential transistors $Q_{b1}$, $Q_{b2}$ constituting the switching circuit $9b$ so that an electric current $i_{SUM(-)}$ flows through one of the differential transistors $Q_{b1}$, $Q_{b2}$ as a pair. The collector of the transistor $Q_{b1}$ is connected to an output terminal 12 for outputting the electric current $i_{OUT(-)}$.

Each of collectors of the transistors $Q_{a2}$, $Q_{b2}$ is connected to a terminal 14 for outputting a constant direct electric current $i_{DC}$ ($=i_{SUM(+)}+i_{SUM(-)}$).

In the deglitcher circuit 9, the electric current $i_{sum(+)}$ flowing through one of the differential transistors $Q_{a1}$, $Q_{a2}$ as a pair is a sum of electric currents having dispersion in switching timings from transistors $Q_{11}$, $Q_{21}$, - - - , $Q_{151}$, $Q_{161}$ so that noises at a transient responsive time of switching, i.e., a glitch is included in this sum of electric currents. Similarly, the electric current $i_{SUM(-)}$ flowing through one of the differential transistors $Q_{b1}$, $Q_{b2}$ as a pair is a sum of electric currents having dispersion in switching timings from transistors $Q_{12}$, $Q_{22}$, - - - , $Q_{152}$, $Q_{162}$ so that noises at a transient responsive time of switching, i.e., a glitch is included in this sum of electric currents.

As mentioned above, the deglitch signal DGL1 of the normal phase is supplied to the bases of the transistors $Q_{a1}$, $Q_{b1}$, and the switching signal of the reverse phase is supplied to the bases of the transistors $Q_{a2}$, $Q_{b2}$. Accordingly, the electric current $i_{SUM(+)}$ flowing through the switching circuit $9a$ is not changed irrespective of switching of the transistors $Q_{a1}$, $Q_{a2}$. Further, the electric current $i_{SUM(-)}$ flowing through the switching circuit $9b$ is not changed irrespective of switching of the transistors $Q_{b1}$, $Q_{b2}$.

Next, an operation of the deglitcher circuit 9 will be explained with reference to timing charts of FIGS. 4A to 4D. FIGS. 4A and 4B show waveforms of switching signals $SW_{n1}$, $SW_{n2}$ (here, n=1, 2, - - - , 15, 16) of the normal and reverse phases generated from the converting circuit 7 and respectively supplied to the bases of the differential transistors of the switching circuits $8_1$, $8_2$, - - - , $8_{15}$, $8_{16}$ of the switching circuit 8. These switching signals $SW_{n1}$, $SW_{n2}$ are signals for switching data at every (1/64FS)(sec) in accordance with 64FS (Hz) in sampling frequency of an input signal.

FIGS. 4C and 4D show waveforms of the deglitch signals DGL1, DGL2 of the normal and reverse phases generated from the deglitch signal generating circuit 9A and respectively supplied to the bases of transistors $Q_{a1}$, $Q_{b1}$ and transistors $Q_{a2}$, $Q_{b2}$. Each of the deglitch signals DGL1, DGL2 is a rectangular wave signal having the (1/64FS) second in period and 50% in duty. The deglitch signals DGL1, DGL2 are respectively shifted from the switching signals $SW_{n1}$, $SW_{n2}$ by (1/256FS) second. The deglitch signal DGL1 is turned-off at switching timing of the switching signals $SW_{n1}$, $SW_{n2}$.

When the deglitch signal DGL1 has a high (H) level, the transistors $Q_{a1}$, $Q_{b1}$ are turned on so that electric currents $i_{OUT(+)}$ and $i_{OUT(-)}$ including no glitch flow through the respective collectors of these transistors. When the deglitch signal DGL1 has the high (H) level, the deglitch signal DGL2 has a low (L) level. Accordingly, the transistors $Q_{a2}$, $Q_{b2}$ are turned off so that no electric current flows through each of the collectors of these transistors. When the deglitch signal DGL2 has a high (H) level, the transistors $Q_{a2}$, $Q_{b2}$ are turned on.

No collector outputs of the transistors $Q_{a2}$, $Q_{b2}$ are used as D/A converting outputs. However, when the transistors $Q_{a1}$, $Q_{b1}$ are turned off, the transistors $Q_{a2}$, $Q_{b2}$ are required to respectively flow constant electric currents $i_{SUM(+)}$ and $i_{SUM(-)}$ to a connecting middle point of transistors $Q_{a1}$, $Q_{a2}$ and a connecting middle point of transistors $Q_{b1}$, $Q_{b2}$.

Here, a clock signal of 256FS (Hz) is used as the deglitch signal DGL1. However, another signal may be used if the switching signals $SW_{n1}$, $SW_{n2}$ are switched and switching timing of electric current outputs can be avoided.

The level of a D/A converting output can be controlled by changing a time width of the deglitch signal DGL1 at the high level. Accordingly, a signal level variable function (voice amount variable function) can be given to this D/A converter. A time width variable means for changing this time width can be arranged within the deglitch signal generating circuit 9A, but can be also arranged outside the deglitch signal generating circuit 9A. Requantizing noises are generated in the case of a volume function in which conventional input digital data are multiplied by digital volume data. However, such requantizing noises are not caused in the case of the signal level variable function provided to this D/A converter. Accordingly, the level variable means of an ideal digital signal can be realized without any reduction in accuracy of the digital data.

The 4-bit data/parallel 16-line electric current switch data converting circuit 7 will next be explained with reference to FIG. 5. FIG. 6 shows waveforms of signals of respective portions shown in FIG. 5. Parallel 4-bit data DIN1 to DIN4 from the noise shaper section 4 are supplied to an input terminal 17. Switching signals $SW_{11}$, $SW_{21}$, - - - , $SW_{151}$ of a normal phase are outputted to output terminals $28_{11}$, $28_{21}$, - - - , $28_{151}$, $28_{161}$. Switching signals $SW_{161}$; $SW_{12}$, $SW_{22}$, - - - , $SW_{152}$, $SW_{162}$ of a reverse phase are outputted to output terminals $28_{12}$, $28_{22}$, - - - , $28_{152}$, $28_{162}$. The switching signals of the normal and reverse phases are respectively supplied to the bases of transistors $Q_{11}$, $Q_{21}$, - - - , $Q_{151}$, $Q_{161}$ and the bases of transistors $Q_{12}$, $Q_{22}$, - - - , $Q_{152}$, $Q_{162}$ in the switching circuits $8_1$ to $8_{16}$ of the parallel 16-line electric current source ECL switching circuit 8.

A number obtained by removing number (1 or 2) of a digit 1 from an index number of the character SW of these switching signals ranges from 1 to 16 and is called an address and is represented by n (n=1, 2, 3,- - - , 16). Thus, when characters of the above switching signals are represented by using n, these characters can be represented by $SW_{n1}$, $SW_{n2}$. If the switching signal $SW_{n1}$ is set to have a high (H) level and the switching signal $SW_{n2}$ is therefore set to have a low (L) level, a transistor $Q_{n1}$ of an arbitrary switching circuit $8_n$ of the switching circuit 8 can be turned on and a transistor $Q_{n2}$ of this arbitrary switching circuit $8_n$ can be turned off. Thus, the value of an electric current flowing through the deglitcher circuit 9 is determined by 4 bits, i.e., sixteen kinds of data.

A condition as to how to select a switching signal SWn providing the value of an electric current to be flowed in the D/A converter will next be explained.

[Condition 1]

An address n is selected at random. In this case, the same address is not used unless all sixteen addresses are used at any time in conversion of one data or continuous several data. When all the sixteen addresses are used at any time in the conversion of one data or continuous several data, the next used address is selected at random.

This condition 1 is an ideal selecting method. If this condition 1 is satisfied, when constant electric currents of the sixteen constant electric current sources $10_1$ to $10_{16}$ of the constant electric current source 10 are dispersed, noises caused by this dispersion can be set to random noises (=white noises) so that characteristic deterioration can be improved.

Figure 3:
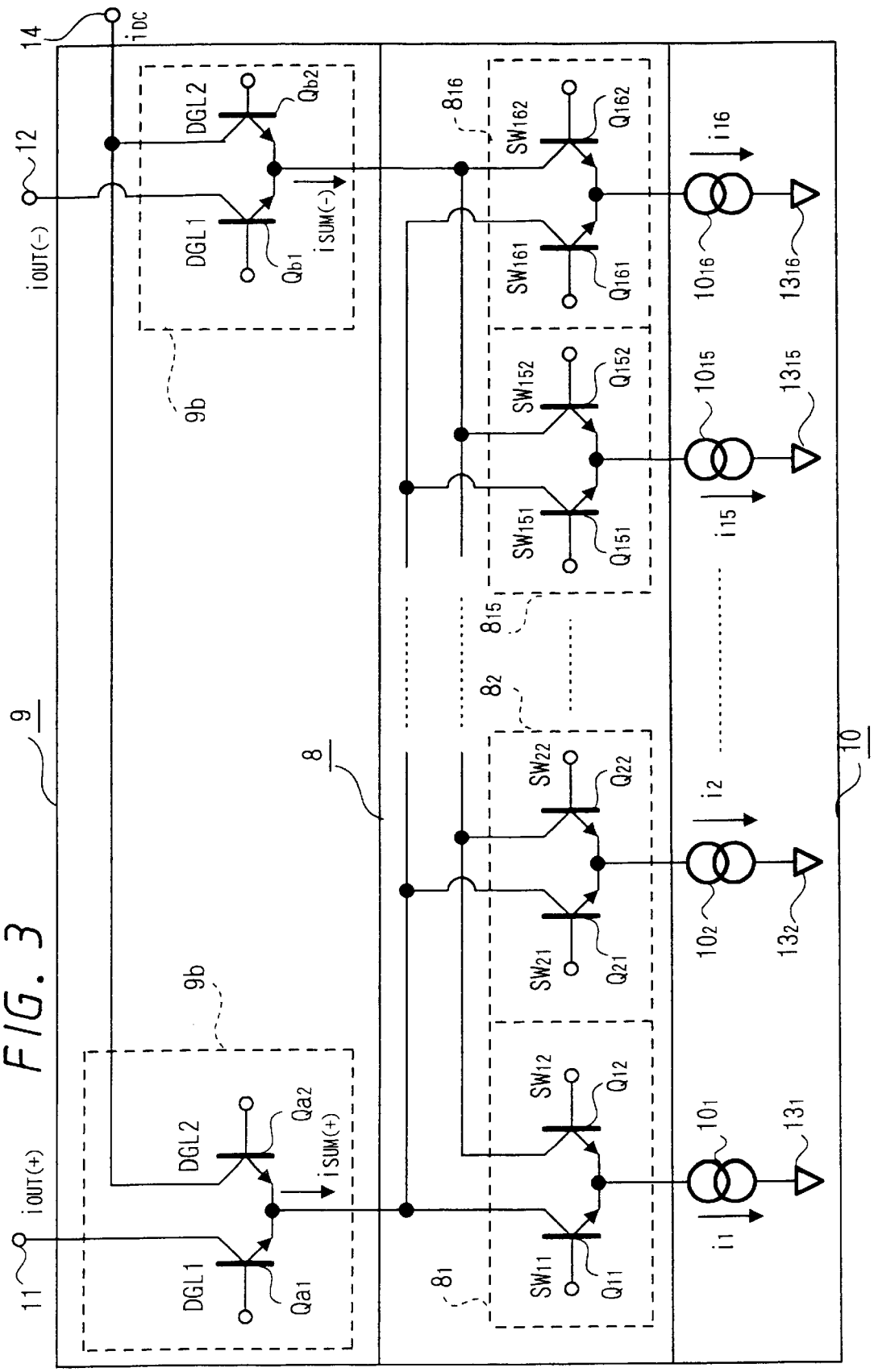
FIG. 3 is a circuit diagram showing a concrete circuit of one portion of the D/A converter in the embodiment.
Figure 4:
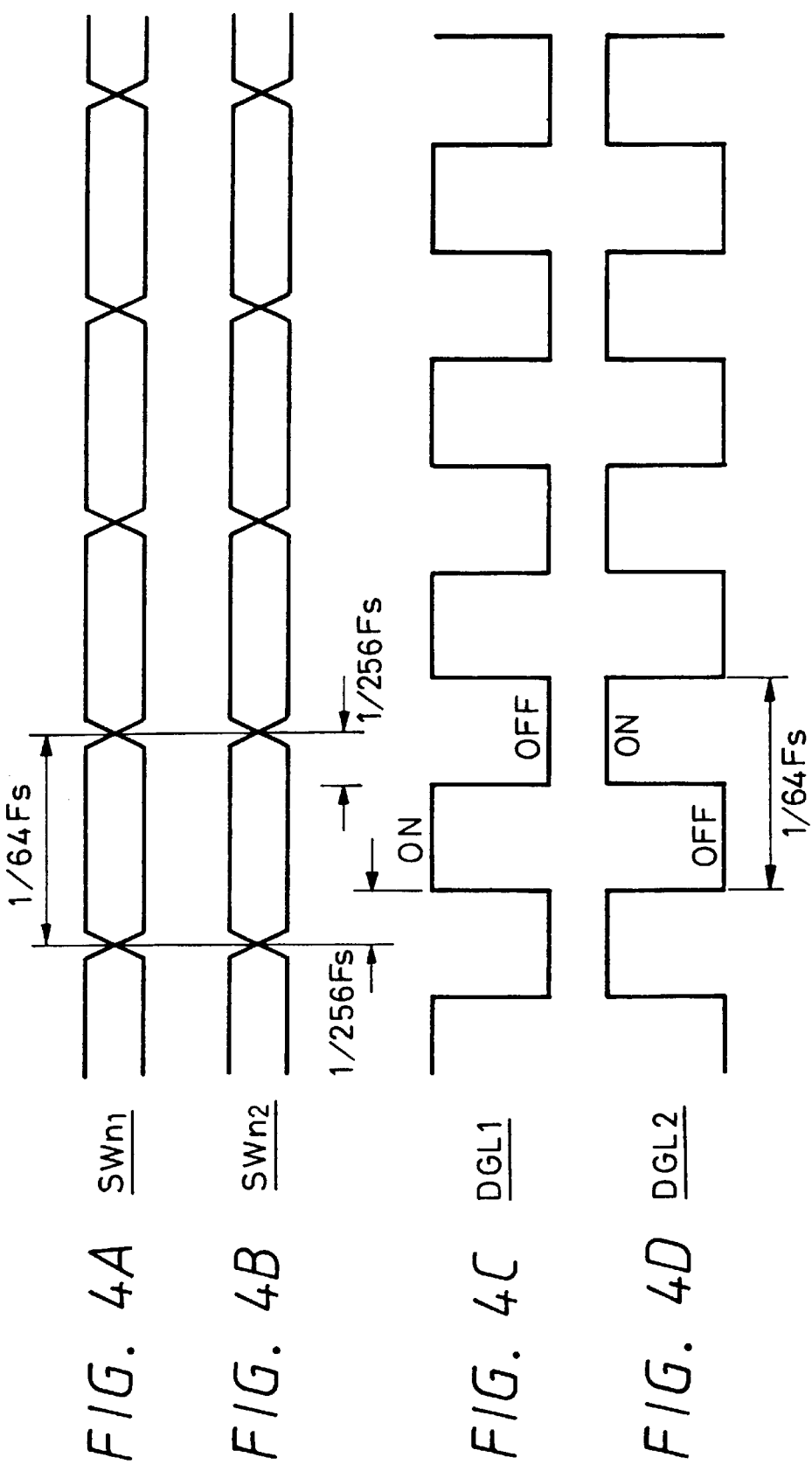
FIGS. 4A to 4D are timing charts of signals supplied to the circuit of FIG. 3.

When a D/A converter for satisfying the condition 1 is obtained, circuit scales of the constant electric current source, the switching circuit and the deglitcher circuit are respectively several times the constant electric current source 10, the switching circuit 8 and the deglitcher circuit 9 shown in FIG. 3. Accordingly, it is impossible to avoid deterioration of the performance of an analog circuit by digital noises. Further, the cost of the D/A converter is increased so that it is difficult to realize such a D/A converter. Therefore, a practical condition as to how to select a switching signal $SW_n$ providing the value of an electric current to be flowed in the D/A converter will next be explained.

[Condition 2]

When plural switching signals $SW_{n1}$ are set to have a high (H) level, continuous addresses are used. In this case, n=1 is set after n=16. Further, the next address to a final address among the addresses of continuous switching signals used in data previously located by one sample is set to a starting address of the present data.

A concrete example of the condition 2 will next be described. When input data show 3, switching signals SWn1 at three addresses such as switching signals $SW_1$, $SW_2$, $SW_3$ and $SW_{15}$, $SW_{16}$, $SW_1$ are set to have high voltage levels. For example, when the data previously located by one sample are set to show 3 and switching signals $SW_{151}$, $SW_{161}$, $SW_{11}$, are set to have high levels, the present data are started from address n=2. For example, when the present data show 5, switching signals $SW_{21}$, $SW_{31}$, $SW_{41}$, $SW_{51}$, $SW_{61}$ are set to have high levels.

If the above condition 2 is satisfied, the same address is not used unless all sixteen addresses are used at any time in the conversion of one data or continuous several data. Further, the switching signals $SW_{n1}$ set to have high levels by the value of input data do not form a fixing pattern. Accordingly, noises and distortion caused by dispersion of the individual constant electric current sources $10_1$ to $10_{16}$ of the constant electric current 10 can be dispersed so that deterioration of each of ratios S/N and S/(THD+N) can be restrained. Here, the S/(THD+N) shows a ratio of an input signal component S to a sum (THD+N) of signal components except for an input signal having a frequency from 0 Hz to 20 kHz. Further, the S/N shows a ratio of the input signal component S to a sum N of signal components except for the input signal having a frequency from 0 Hz to 20 kHz when the input signal component S is set to show 0 dB, i.e., 1 in the case of a zero signal input.

Figure 5:
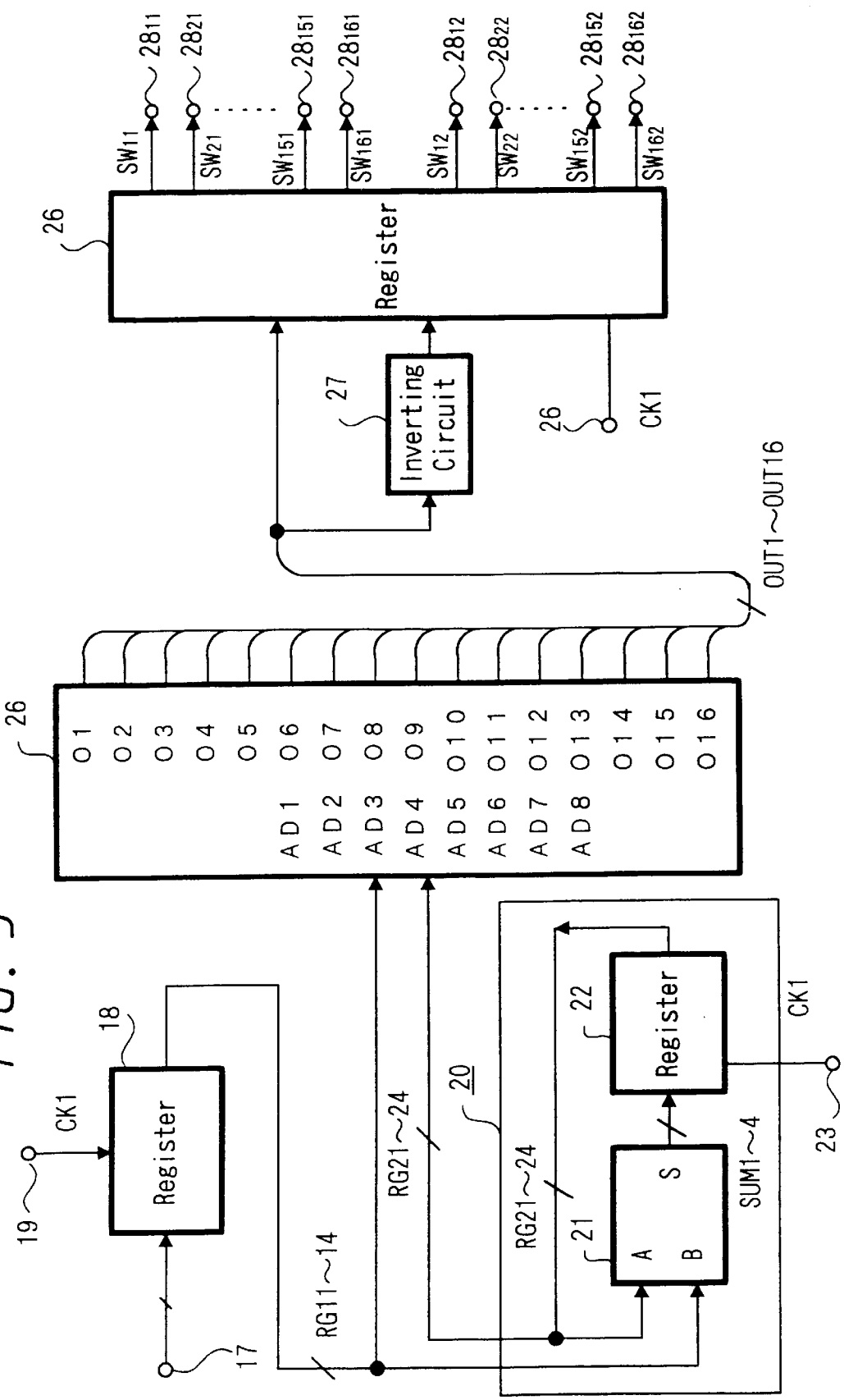
FIG. 5 is a circuit diagram showing a concrete circuit of one portion of the D/A converter in the embodiment.
Figure 6:
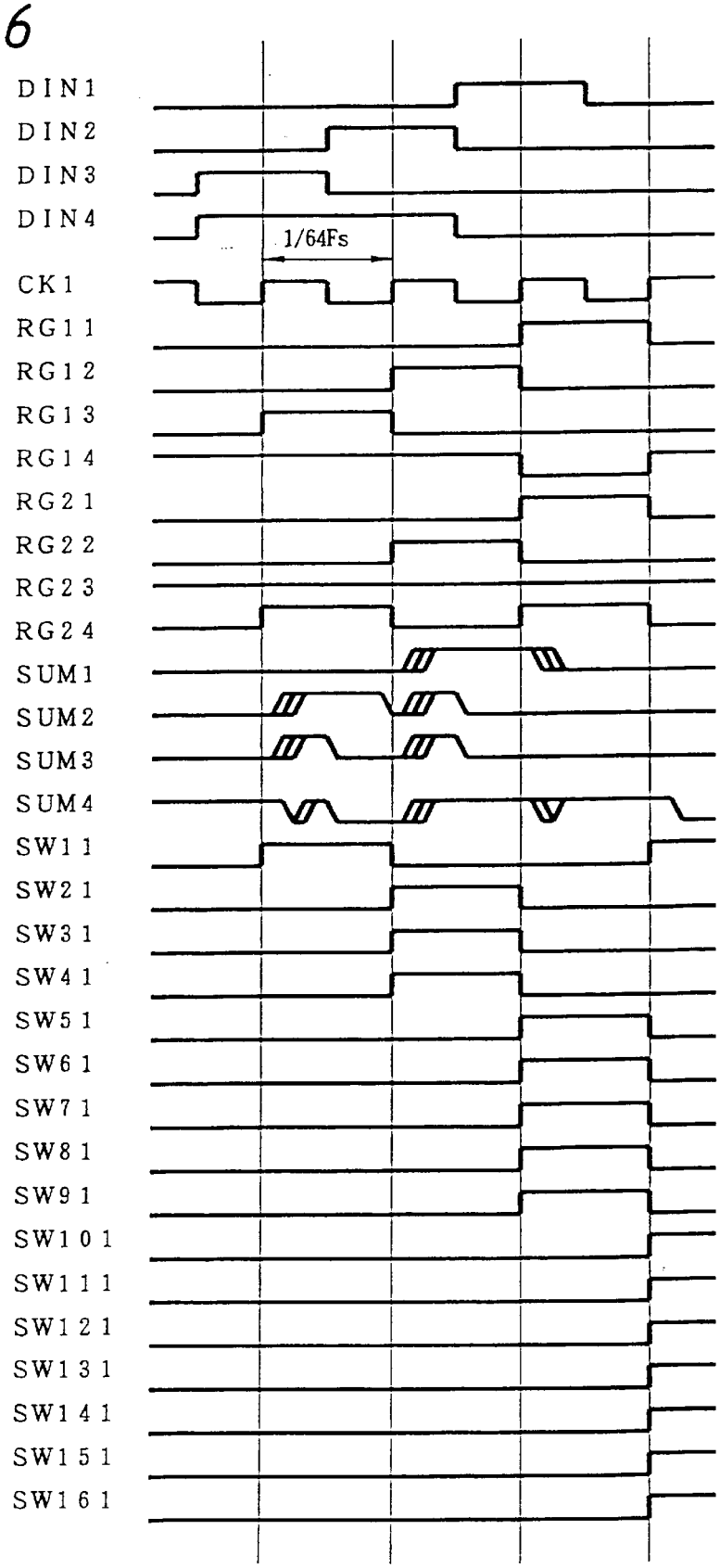
FIG. 6 is a signal timing channel of each portion of FIG. 5.

A concrete construction of the converting circuit 7 shown in FIG. 5 satisfies this condition 2. The 4-bit data/parallel 16-line electric current switching data converting circuit 7 of this FIG. 5 will next be explained with reference to a timing chart of FIG. 6. 4-bit parallel data DIN1 to DIN4 from the noise shaper section 4 are supplied to the input terminal 17. These 4-bit parallel data DIN1 to DIN4 may be also serial data. In this case, a data transfer rate is increased (four times in this example) and a clock signal having a sufficiently high frequency is required so that it is necessary to consider an influence of high frequency noises. However, in the case of the parallel data, such consideration is not required.

The 4-bit parallel data DIN1 to DIN4 inputted to the input terminal 17 are supplied to a register 18 and are taken into this register 18 at a rising edge of a clock signal CK1 supplied to an input terminal 19. This clock signal CK1 is a clock signal having the same period as the 4-bit parallel data DIN1 to DIN4. 4-bit parallel data RG11 to RG14 outputted from the register 18 are supplied to input terminals AD1 to AD4 of a 4-bit data+final address data/16-bit data converting circuit 24.

A final address detecting circuit 20 is constructed by a 4-bit adder 21 and a register 22 at the next stage. The 4-bit parallel data RG11 to RG14 outputted from the register 18 are supplied to an input terminal B of the 4-bit adder 21. Further, 4-bit parallel data RG21 to RG24 outputted from the register 22 are supplied to an input terminal A of the 4-bit adder 21. The 4-bit parallel data RG11 to RG14 and the 4-bit parallel data RG21 to RG24 are added to each other in the 4-bit adder 21. Adding outputs SUM1 to SUM4 of the 4-bit adder 21 from its output terminal S are supplied to the register 22 and are taken into this register 22 at a rising edge of the clock signal CK1 supplied to an input terminal 23. The 4-bit parallel data RG21 to RG24 from the register 22 are supplied to input terminals AD5 to AD8 of the converter circuit 24.

This final address detecting circuit 20 accumulatively adds the 4-bit parallel data DIN1 to DIN4 supplied to the input terminal 17. In this case, the adding outputs SUM1 to SUM4 of the adder 21 are constructed by parallel four bits so that added results thereof are obtained by performing the operation of a remainder system of 16. These contents will next be explained by using one example. For example, when 4-bit data 1110H (14 as a decimal number) and 0011H (3 as a decimal number) are respectively supplied to the input terminals A and B, output data at the output terminal S become 0001H (1 as a decimal number) and are not 17 as a decimal number. Therefore, it should be understood that the operation of the remainder system of 16 is performed.

Accordingly, "the final address among continuous switching addresses n used in data previously located by one sample" described in the above condition 2 can be outputted as an adding output of the adder 21. In reality, "the final address among the continuous switching addresses n used in data previously located by one sample with respect to data of the register 22" is detected by taking into the outputs SUM1 to SUM4 of the adder 21 to the register 22 and outputting these outputs from the register 22 by the clock signal CK1. Namely, each of the outputs of the register 22 becomes "the final address among the continuous switching addresses n used in data previously located by one sample".

The converting circuit 24 determines one of output data OUT1 to OUT16 transmitted from output terminals 01 to 016 and set to have a high level by the 4-bit parallel data RG11 to RG14 supplied to the input terminals AD1 to AD4 and the data RG21 to RG24 supplied to the input terminals AD5 to AD8 at the final address among the continuous switching addresses n used in data previously located by one sample.

The converting circuit 24 can be simply constructed by a ROM having an input terminal of 8 bits and an output terminal of 16 bits.

The output data OUT1 to OUT16 of 16 bits from the converting circuit 24 are directly supplied to a register 25 and are also supplied to an inverting circuit 27 and are logically inverted in this inverting circuit 27. Thereafter, the inverted data are supplied to the register 25 and are taken into this register 25 by the clock signal CK1 supplied to an input terminal 26. Switching signals $SW_{11}$, $SW_{21}$, - - -, $SW_{151}$, $SW_{161}$ and switching signals $SW_{12}$, $SW_{22}$, - - -, $SW_{152}$, $SW_{162}$ are respectively outputted to output terminals $28_{11}$, $28_{21}$, - - -, $28_{151}$, $28_{161}$ and output terminals $28_{12}$, $28_{22}$, - - -, $28_{152}$, $28_{162}$ and are respectively supplied to bases of switching transistors $Q_{11}$, $Q_{21}$, $Q_{151}$, $Q_{161}$ and switching transistors $Q_{12}$, $Q_{22}$, - - -, $Q_{152}$, $Q_{162}$ of the respective switching circuits $8_1$, $8_2$, - - -, $8_{16}$ of the switching circuit 8.

In this case, as can be seen from switching signals $SW_{11}$ to $SW_{161}$ of FIG. 6, for example, only transistor $Q_{11}$ is turned on and the remaining transistors are turned off at a certain interval in the switching circuit 8. Only transistors $Q_{21}$, $Q_{31}$, $Q_{41}$ are turned on and the remaining transistors are turned off at the next interval. Transistors $Q_{51}$, $Q_{61}$, $Q_{71}$, $Q_{81}$, $Q_{91}$ are turned on and the remaining transistors are turned off at the further next interval. Transistors $Q_{101}$, $Q_{111}$, $Q_{121}$, $Q_{131}$, $Q_{141}$, $Q_{151}$, $Q_{161}$, $Q_{11}$ are turned on and the remaining transistors are turned off at the even further next interval.

In the above construction, the switching signals $SW_{11}$, $SW_{21}$, - - -, $SW_{151}$, $SW_{161}$ and the switching signals $SW_{12}$, $SW_{22}$, - - -, $SW_{152}$, $SW_{162}$ for switching the sixteen constant electric current sources $10_1$ to $10_{16}$ based on the condition 2 can be generated at a low operational frequency without requiring any counter and any shift register and without requiring any clock signal having a high frequency equal to or greater than a sampling frequency of input data.

Simulation results of the D/A converter (in an adopting case of the condition 2) of a multibit type in the embodiment and the conventional D/A converter of the multibit type will next be explained by comparing these simulation results with each other. Here, the conventional D/A converter of the multibit type sequentially turns on constant electric current sources at continuous addresses (sets these constant electric current sources to high levels) by the number of input data from switching addresses n within one sample data in the D/A converter of the multibit type in the embodiment. For example, when the input data show 1, a switching circuit at switch address n=1 is turned on. When the input data show 2, switching circuits at switch addresses n=1, 2 are turned on. When the input data show 3, switching circuits at switch addresses n=1, 2, 3 are turned on. This D/A converter means the conventional D/A converter of a general multibit type.

Modeling of the electric current sources will next be explained. In this example, a model of 4 bits, i.e., sixteen constant electric current sources are prepared and the constant electric currents are dispersed from an ideal current value, i.e., 1.0. In this dispersion, the constant electric currents of the sixteen constant electric current sources are dispersed within a range of ±3σ in accordance with a normal distribution of standard deviation σ=0.33%. This model of the constant electric current sources is shown in Table 1 in FIG. 7. In this table 1, constant electric currents $i_n = i_1$, $i_2$, $i_3$, - - -, $i_{16}$ respectively correspond to constant electric currents $i_1$, $i_2$, $i_3$, - - -, $i_{16}$ of the respective electric current sources (constant electric current sources) $10_1$, $10_2$, $10_3$, - - -, $10_{16}$ of the electric current source (constant electric current source) 10 of FIG. 3.

Table 2 of FIG. 8 shows an allocating method of the switching addresses n with respect to the constant electric current sources. The constant electric currents are modeled by such a dispersing method because it is considered that a relative error between the sixteen individual constant electric current sources on the same chip approximately lies within the range of ±3σ in accordance with the normal distribution of standard deviation σ=0.33% when the D/A converter is really formed by an IC and no special alignment is made.

In the simulated D/A converter, an input signal having a sampling frequency $F_s$=44.1 kHz is transmitted through an input terminal. For example, a digital audio signal having FS (Hz) in sampling frequency and 16 bits in word length is supplied to the digital low pass filter section 2 in which a passing band is set to an audible band (0 to 20 kHz). For example, the sampling frequency is upsampled eight times and this upsampled digital audio signal is outputted. This digital audio signal as an output of the digital low pass filter section is supplied to the linear interpolating section. In this linear interpolating section, for example, the sampling frequency is further upsampled eight times and a digital audio signal having a sampling frequency of 64FS (Hz) is outputted. A word length of the digital audio signal outputted from this linear interpolating section 3 is set to 20 bits by a calculation of the linear interpolating section and is longer by four bits than the input word length of 16 bits.

The digital audio signal outputted from the linear interpolating section is supplied to the noise shaper section (Δ-Σ modulator) so that this digital audio signal is quantized to e.g., 4 bits. In this noise shaper section, a low frequency band component of quantizing noises caused in the quantization of the input digital audio signal of 20 bits to 4 bits is shifted to a high frequency band, and a dynamic range in the audible band (0 to 20 kHz) is secured.

The digital audio signal outputted from the noise shaper section and having 64FS (Hz) in sampling frequency and quantized to 4 bits is supplied to the PWM (pulse width modulation) pulse converting section. In the PWM pulse converting section, the pulse width modulation of this digital audio signal is performed. A D/A converting output is obtained on an output side of this PWM pulse converting section.

In this simulation, fast Fourier transformation (FFT) of the D/A converting output is performed. The input signal used in the simulation is set to a quantized sine wave of 1 kHz, 0 dB and 30 bits, a quantized sine wave of 1 kHz, −60 dB and 30 bits, and a zero signal.

Figure 10:
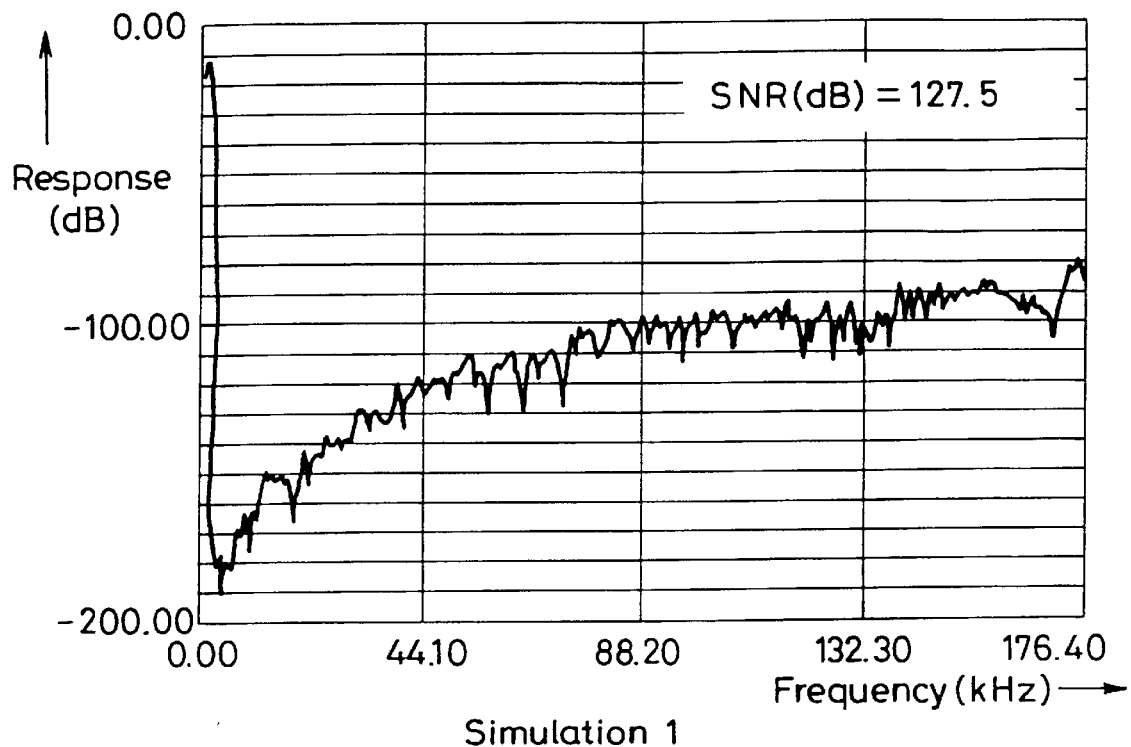
FIG. 10 is a characteristic curve graph (simulation 1) showing characteristics of frequency (kHz)-response (dB) in simulation when there is no dispersion of the respective constant electric current values of constant electric current sources and an input signal is given by a sine wave of 1 kHz, 0 dB and 30 bits.
Figure 11:
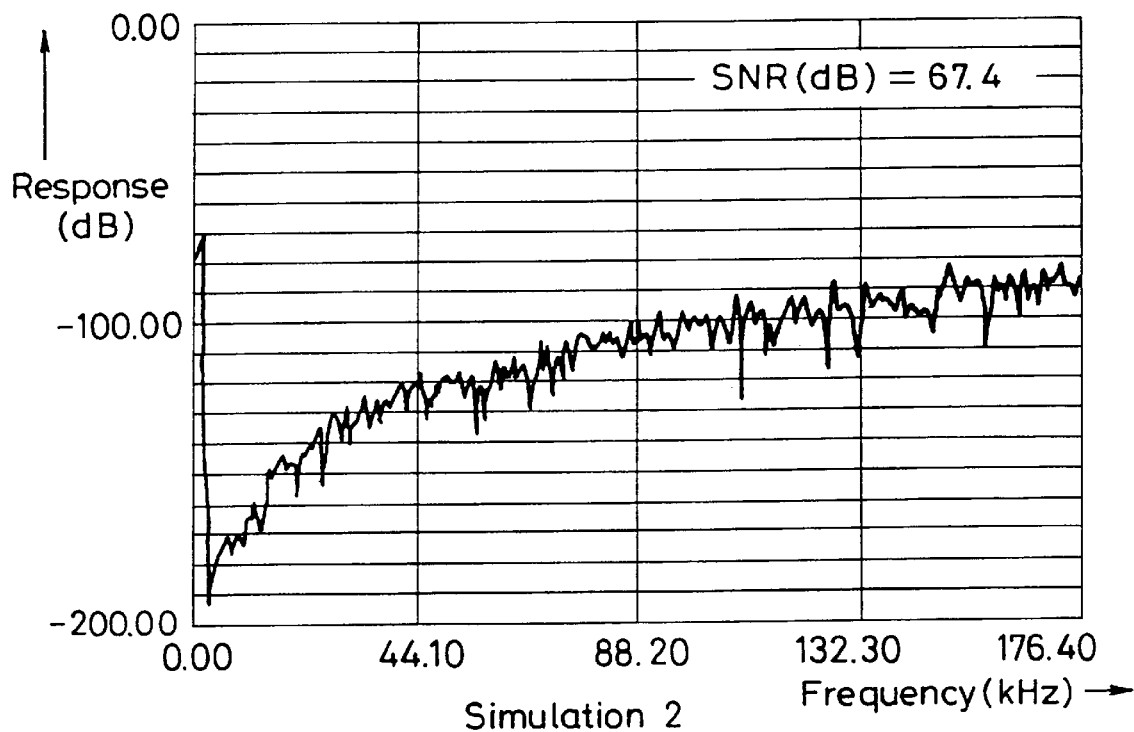
FIG. 11 is a characteristic curve graph (simulation 2) showing characteristics of frequency (kHz)-response (dB) in simulation when there is no dispersion of the respective constant electric current values of constant electric current sources and the input signal is given by a sine wave of 1 kHz, −60 dB and 30 bits.
Figure 12:
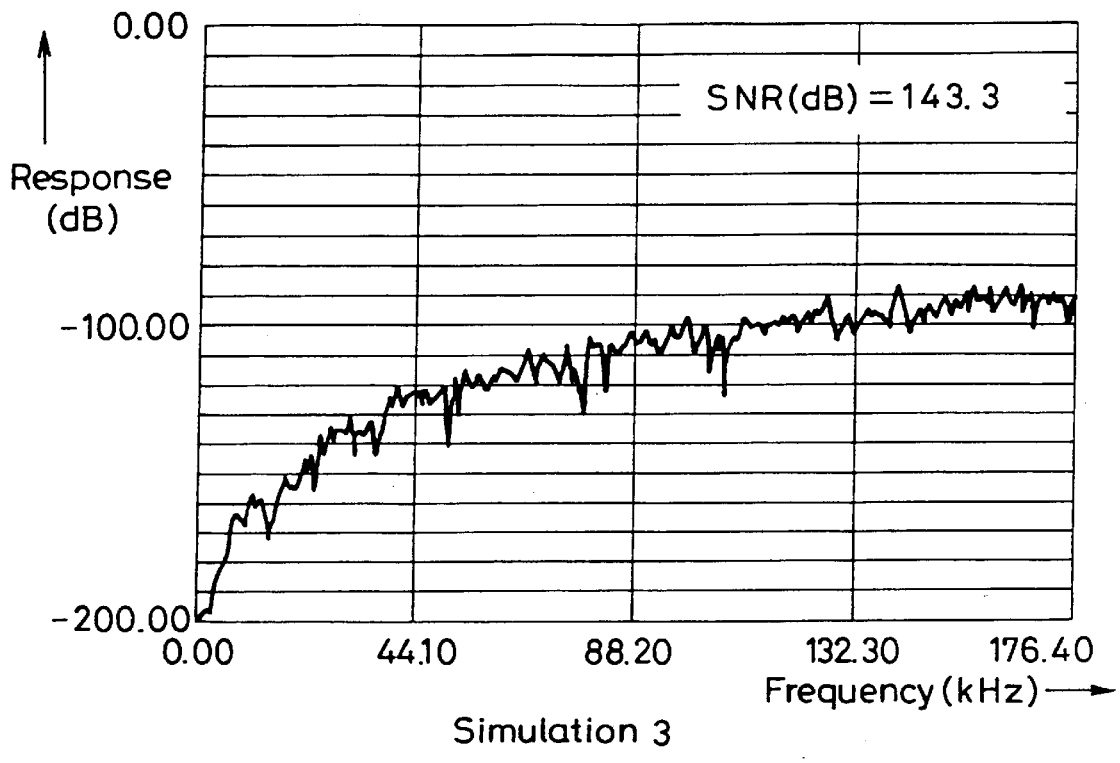
FIG. 12 is a characteristic curve graph (simulation 3) showing characteristics of frequency (kHz)-response (dB) in simulation when there is no dispersion of the respective constant electric current values of constant electric current sources and a zero signal is inputted.

FIG. 10 shows response-frequency characteristics (simulation 1) in the simulation obtained by the fast Fourier transformation (FFT) of the D/A converting output when the electric currents of the respective constant electric current sources are ideally equal to each other and the input signal is set to a sine wave of 1 kHz, 0 dB and 30 bits in the D/A converter of the multibit type in the embodiment. FIG. 11 shows similar response-frequency characteristics (simulation 2) when the input signal is set to a sine wave of 1 kHz, −60 dB and 30 bits. FIG. 12 shows similar response-frequency characteristics (simulation 3) when the input signal is set to a zero signal.

Figure 13:
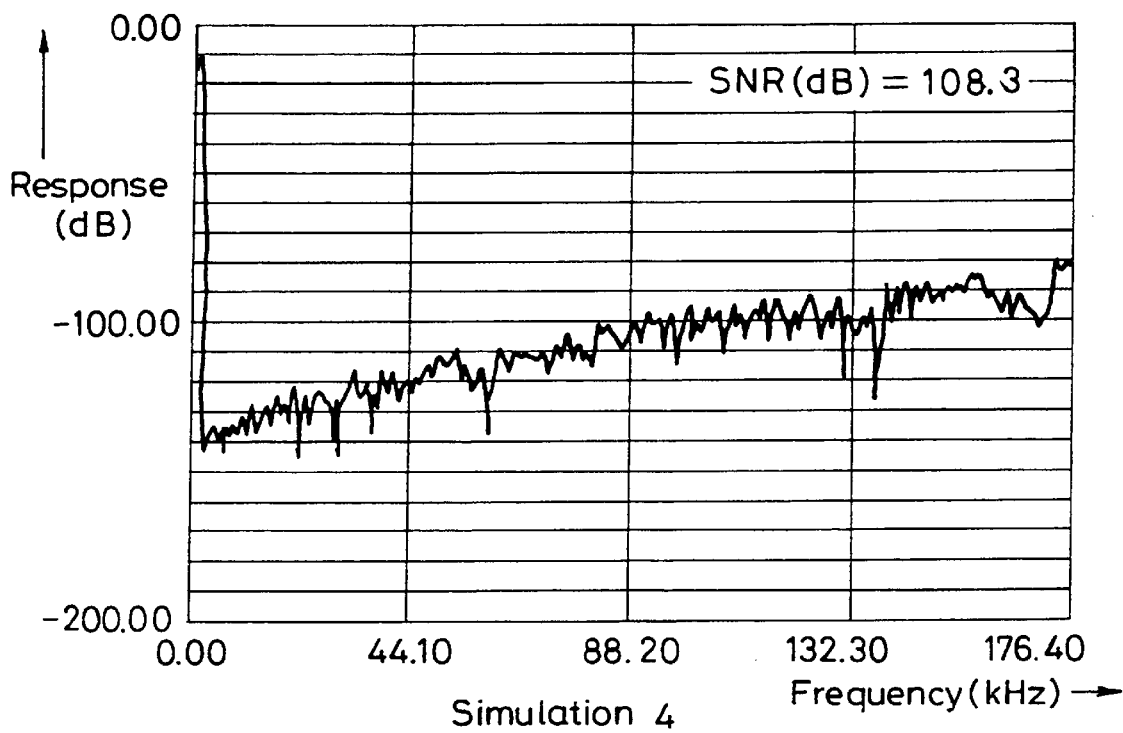
FIG. 13 is a characteristic curve graph (simulation 4) showing characteristics of frequency (kHz)-response (dB) in simulation when a condition 2, the constant electric current source model of FIG. 7 (table 1) and the correspondence of constant electric currents and switching addresses in FIG. 8 (table 2) in the embodiment are adopted and the input signal is given by a sine wave of 1 kHz, 0 dB and 30 bits.
Figure 14:
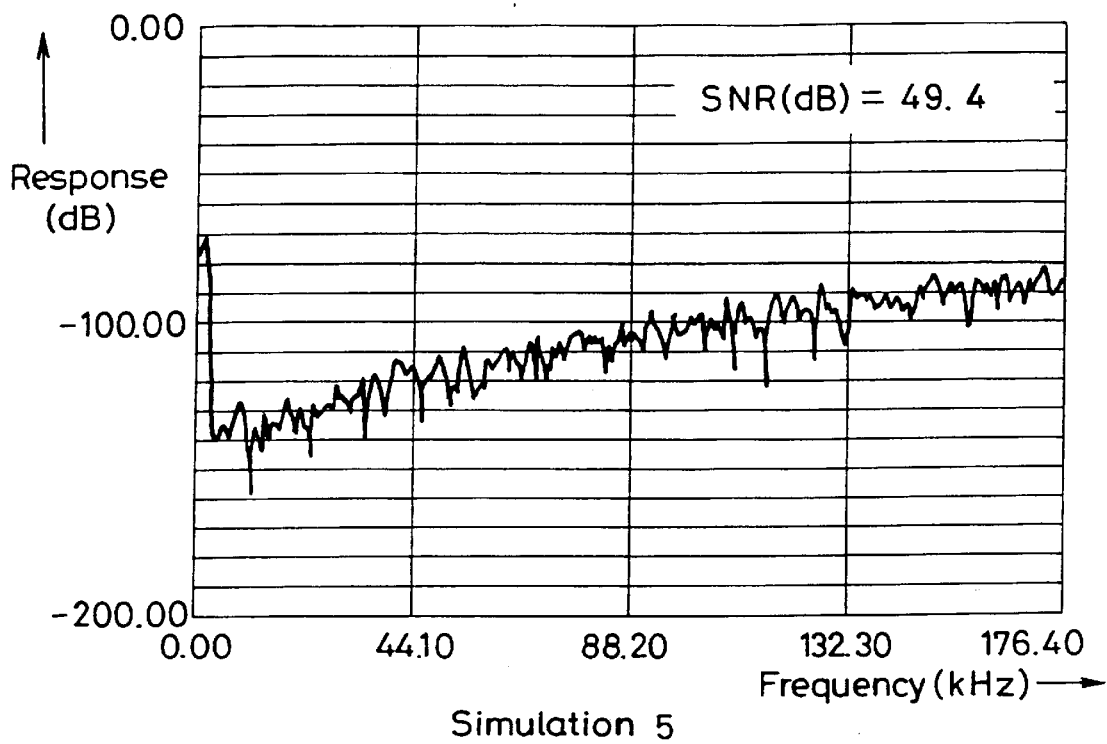
FIG. 14 is a characteristic curve graph (simulation 5) showing characteristics of frequency (kHz)-response (dB) in simulation when the condition 2, the constant electric current source model of FIG. 7 (table 1) and the correspondence of constant electric currents and switching addresses in FIG. 8 (table 2) in the embodiment are adopted and the input signal is given by a sine wave of 1 kHz, −60 dB and 30 bits.
Figure 15:
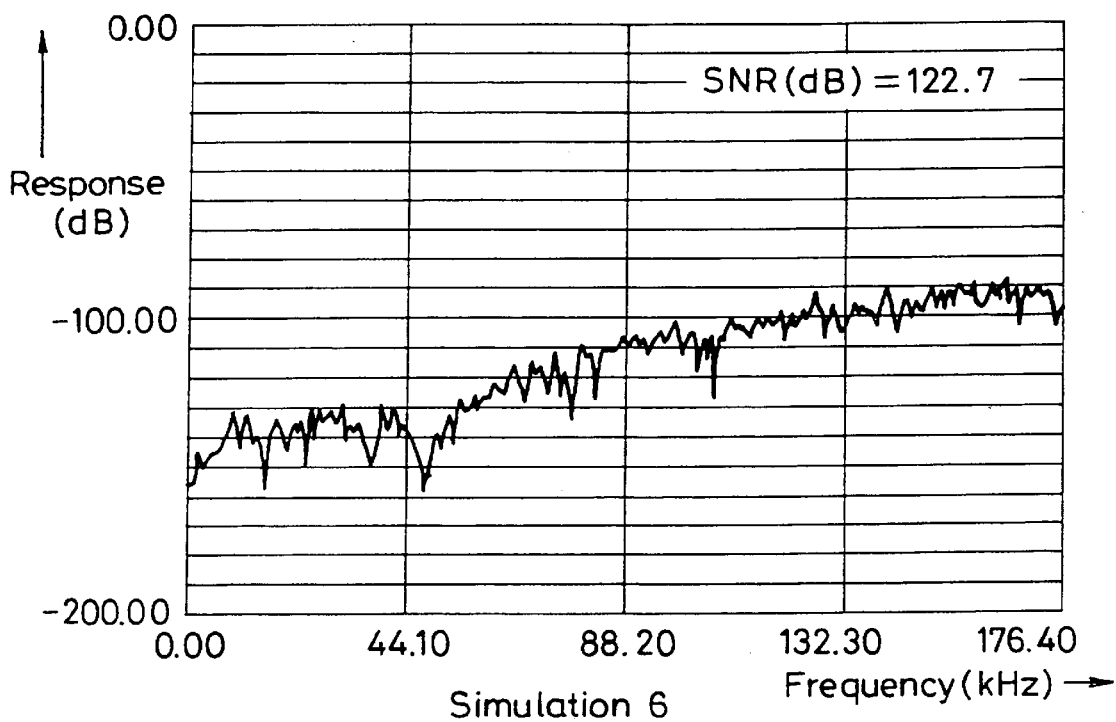
FIG. 15 is a characteristic curve graph (simulation 6) showing characteristics of frequency (kHz)-response (dB) in simulation when the condition 2, the constant electric current source model of FIG. 7 (table 1) and the correspondence of constant electric currents and switching addresses in FIG. 8 (table 2) in the embodiment are adopted and the zero signal is inputted.

FIG. 13 shows response-frequency characteristics (simulation 4) in the simulation obtained by the fast Fourier transformation (FFT) of the D/A converting output when a condition 2 is adopted and the constant electric current source model in the table 1 of FIG. 7 is adopted and the input signal is given by a sine wave of 1 kHz, 0 dB and 30 bits in the D/A converter of the multibit type in the embodiment. FIG. 14 shows similar response-frequency characteristics (simulation 5) when the input signal is given by a sine wave of 1 kHz, −60 dB and 30 bits. FIG. 15 shows similar response-frequency characteristics (simulation 6) when the input signal is set to a zero signal.

Figure 16:
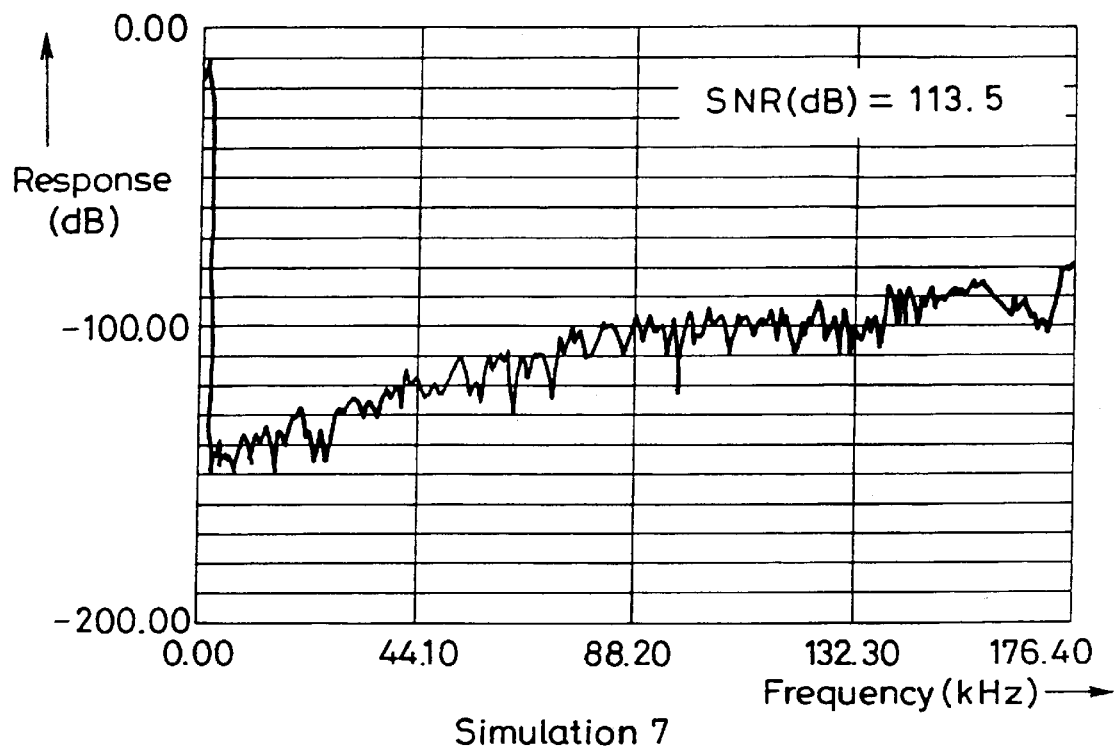
FIG. 16 is a characteristic curve graph (simulation 4) showing characteristics of frequency (kHz)-response (dB) in simulation when the condition 2, the constant electric current source model of FIG. 7 (table 1) and the correspondence of constant electric currents and switching addresses in FIG. 9 (table 3) in the embodiment are adopted and the input signal is given by a sine wave of 1 kHz, 0 dB and 30 bits.
Figure 17:
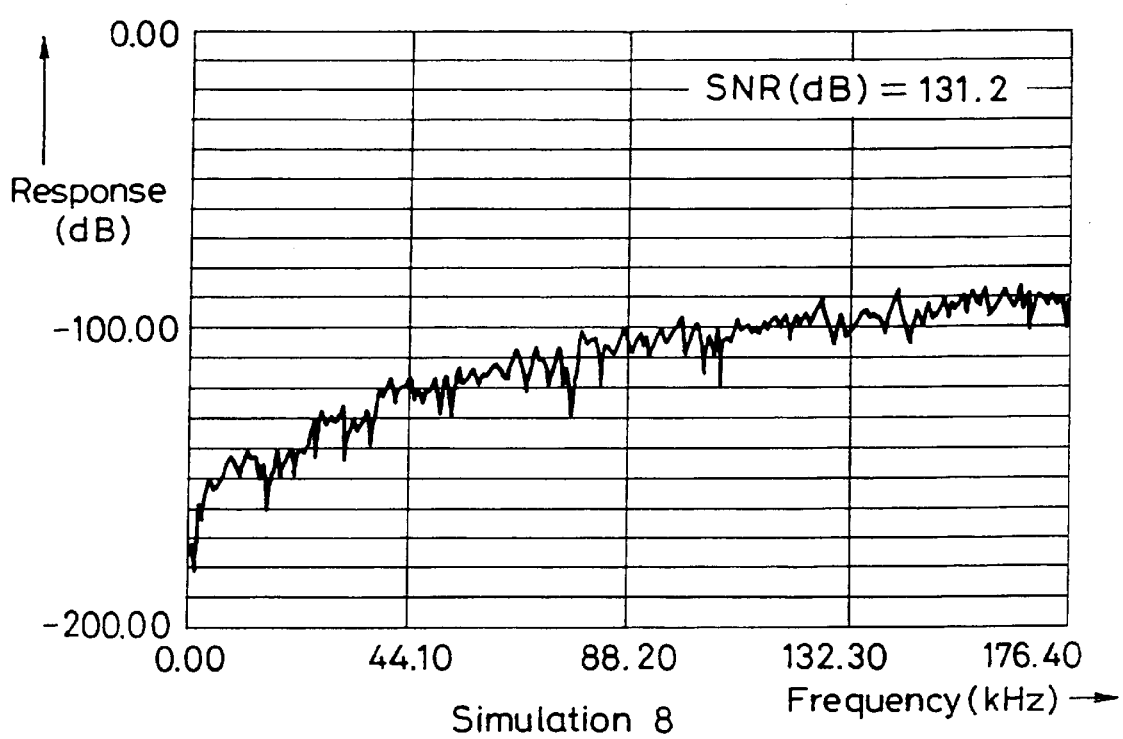
FIG. 17 is a characteristic curve graph (simulation 5) showing characteristics of frequency (kHz)-response (dB) in simulation when the condition 2, the constant electric current source model of FIG. 7 (table 1) and the correspondence of constant electric currents and switching addresses in FIG. 9 (table 3) in the embodiment are adopted and the input signal is given by a sine wave of 1 kHz, −60 dB and 30 bits.

FIG. 16 shows response-frequency characteristics (simulation 7) in the simulation obtained by the high speed Fourier transformation (FFT) of the D/A converting output when the condition 2 is adopted and the constant electric current source model in the table 2 of FIG. 8 is adopted and the input signal is given by a sine wave of 1 kHz, 0 dB and 30 bits in the D/A converter of the multibit type in the embodiment. FIG. 17 shows similar response-frequency characteristics (simulation 8) when the input signal is set to a zero signal.

Figure 18:
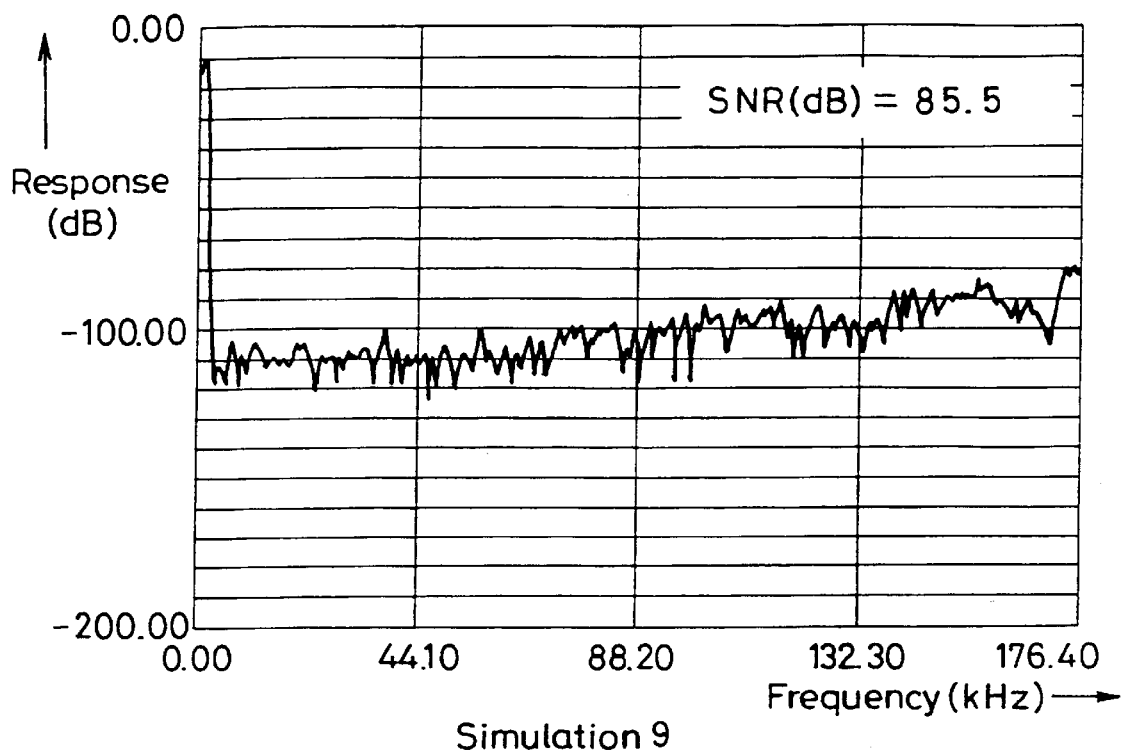
FIG. 18 is a characteristic curve graph (simulation 4) showing characteristics of frequency (kHz)-response (dB) in simulation when the condition 2, the constant electric current source model of FIG. 7 (table 1) and the correspondence of constant electric currents and switching addresses in FIG. 8 (table 2) in the case of the D/A converter of FIG. 1 are adopted and the input signal is given by a sine wave of 1 kHz, 0 dB and 30 bits.
Figure 19:
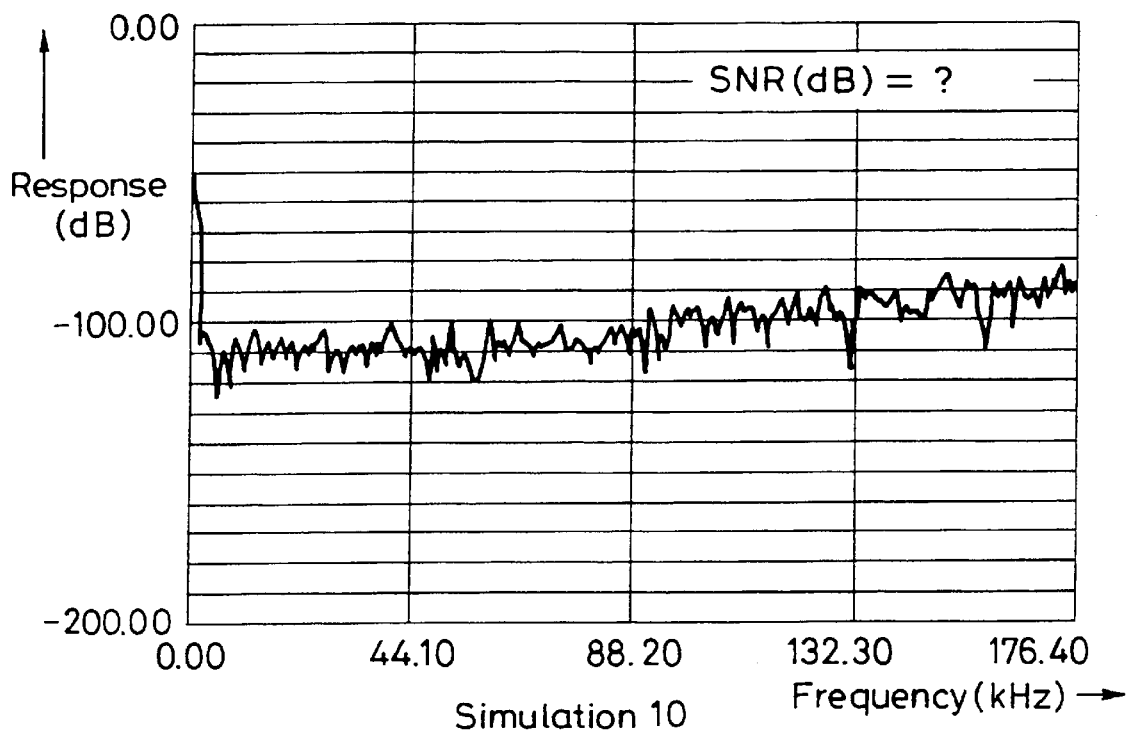
FIG. 19 is a characteristic curve graph (simulation 5) showing characteristics of frequency (kHz)-response (dB) in simulation when the condition 2, the constant electric current source model of FIG. 7 (table 1) and the correspondence of constant electric currents and switching addresses in FIG. 8 (table 2) in the case of the D/A converter of FIG. 1 are adopted and the input signal is given by a sine wave of 1 kHz, −60 dB and 30 bits.
Figure 20:
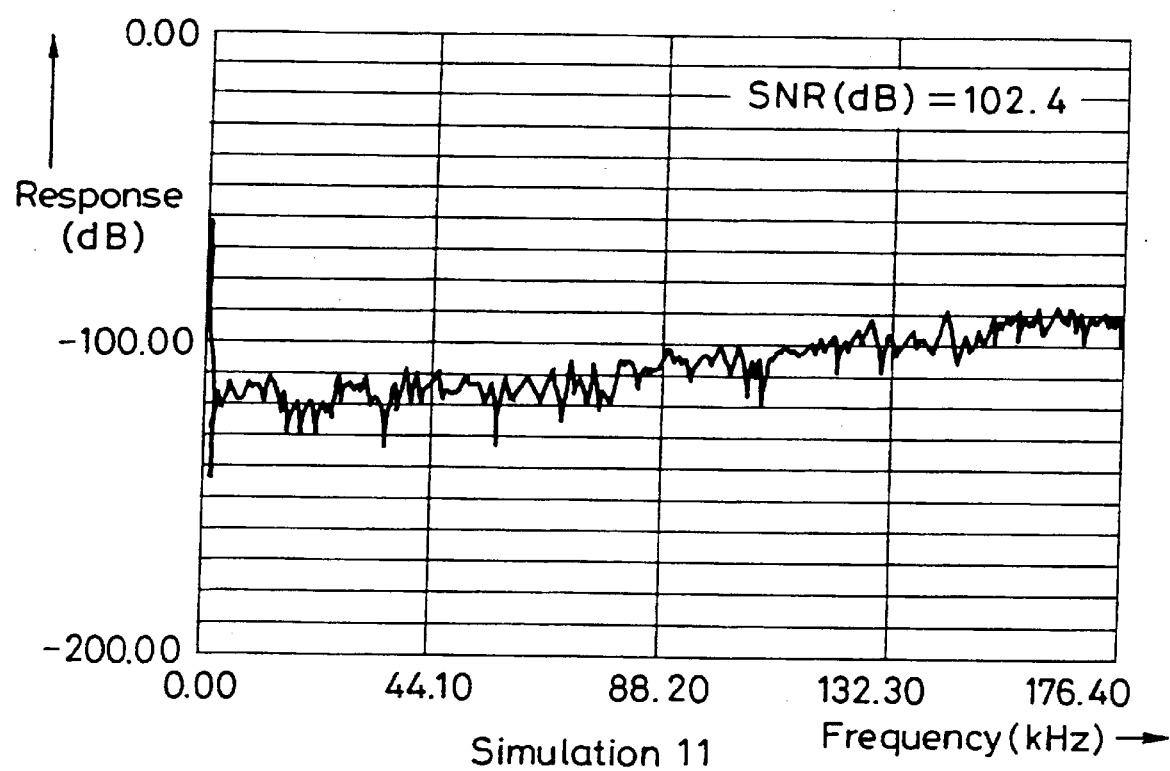
FIG. 20 is a characteristic curve graph (simulation 6) showing characteristics of frequency (kHz)-response (dB) in simulation when the condition 2, the constant electric current source model of FIG. 7 (table 1) and the correspondence of constant electric currents and switching addresses in FIG. 8 (table 2) in the case of the D/A converter of FIG. 1 are adopted and the zero signal is inputted.

FIG. 18 shows response-frequency characteristics (simulation 9) in the simulation obtained by the fast Fourier transformation (FFT) of the D/A converting output when the electric current source model in the table 1 of FIG. 7 is adopted and the input signal is given by a sine wave of 1 kHz, 0 dB and 30 bits in the multibit D/A converter shown in FIG. 1. FIG. 19 shows similar response-frequency characteristics (simulation 10) when the input signal is given by a sine wave of 1 kHz, −60 dB and 30 bits. FIG. 20 shows similar response-frequency characteristics (simulation 11) when the input signal is set to a zero signal.

In FIGS. 10 to 20, an SNR (signal-to-noise ratio) (dB) shows a ratio S/(THD+N) of an input signal component S to a sum (THD+N) of signal components except for the input signal having a frequency from 0 Hz to 20 kHz when no zero signal is inputted. When the zero signal is inputted, the SNR (dB) shows a ratio S/N of the input signal component S to the sum N of signal components except for the input signal having a frequency from 0 Hz to 20 kHz when the input signal component S is set to show 0 dB, i.e., 1.

When the input signal is given by a sine wave of 1 kHz, 0 dB and 30 bits, the ratio S/(THD+N) is deteriorated until 85.5 dB in the case of the D/A converter shown in FIG. 1 in the simulation 9 of FIG. 18. However, in the case of the embodiment adopting the condition 2 of the simulation 4 of FIG. 13, 108.3 dB is obtained as the ratio S/(THD+N) so that this ratio is improved by 20 dB or more in comparison with the D/A converter shown in FIG. 1.

With respect to the ratio S/(THD+N) in the case of the input signal given by a sine wave of 1 kHz, −60 dB and 30 bits, no signal is regenerated in the case of the D/A converter shown in FIG. 1 in the simulation 10 of FIG. 19 and only a direct current component is provided. Accordingly, no linearity is already held with respect to the input signal of −60 dB. However, 49.4 dB is obtained in the case of the embodiment in which the condition 2 of the simulation 5 of FIG. 14 is adopted. When this 49.4 dB is converted to the ratio S/(THD+N) in the case of the input signal having 0 dB, 49.4 dB+60 dB=109.4 dB is obtained. Accordingly, it can be said that linearity is approximately held with respect to the ratio S/(THD+N)=108.3 dB in the case of the above input signal having 0 dB. In the case of a discrete FFT analysis, it is expected that results of this analysis are approximately dispersed by ±3 dB in accordance with states of data near starting and terminal points of an analyzed signal. Accordingly, it is said that such a small error lies within an error range of the FFT analysis itself.

With respect to the S/N ratio in the case of a zero signal input, a direct current component is generated in the case of the D/A converter shown in FIG. 1 in the simulation 11 of FIG. 20. However, when the D/A converter is mounted to an electronic equipment, the direct current component is removed at the former stage of a final output of an analog signal. Accordingly, the S/N ratio is calculated in a state in which the direct current component is removed from simulation results. In this calculation, 102.4 dB is obtained. However, no direct current component is generated and 122.7 dB is obtained in the case of the embodiment adopting the condition 2 of the simulation 6 of FIG. 15. Accordingly, it should be understood that the S/N ratio is improved by 20 dB or more in comparison with the D/A converter shown in FIG. 1.

With respect to the ratio S/(THD+N) in the case of the input signal given by a sine wave of 1 kHz, 0 dB and 30 bits, 108.3 dB is obtained as mentioned above in the case of the embodiment adopting the condition 2 of the simulation 4 of FIG. 13. This means that the D/A converter has a converting accuracy corresponding to 18 bits. These 18 bits exceed 16 bits as a converting accuracy of the D/A converter mounted on a CD (compact disk) player. Accordingly, this means that the converting accuracy corresponding to the 18 bits is practically a sufficiently high accuracy.

In the cases of the simulations of the above embodiment, the switching addresses n with respect to the constant electric currents $i_1$ to $i_{16}$ of the constant electric current sources $10_1$ to $10_{16}$ of the constant electric current source 10 of FIG. 3 are allocated in a small order of a suffix i showing a constant electric current as shown in the table 2 of FIG. 8. However, characteristics similar to the above characteristics are also obtained when the switching addresses n are reversely allocated in a large order of the suffix i showing a constant electric current. This can be also realized when the D/A converter is formed by a semiconductor IC (integrated circuit). Namely, if the sixteen constant electric current sources are arranged in a one-line layout shape on a semiconductor IC chip, each of the constant electric currents tends to be monotonously increased or decreased in an arranging direction of these constant electric current sources. Accordingly, the switching addresses n may be allocated in the arranging direction of the constant electric current sources.

If a tendency to the dispersion of the constant electric currents of the sixteen constant electric current sources on the actual semiconductor IC chip is known in this way, the converting accuracy can be further increased in consideration of an allocating method of the switching addresses n. Therefore, when the table 1 of FIG. 7 is adopted as an electric current source model and the switching addresses are allocated as shown in the table 3 of FIG. 9, there is a tendency to $i_1 < i_2 < i_3$ - - - $< i_{15} < i_{16}$ between the constant electric currents $i_1$ to $i_{16}$ of the constant electric current sources. Accordingly, the switching addresses are allocated such that a maximum constant electric current is next to a minimum constant electric current and the further next is a twelfth smallest one, the even further next is a second largest one, - - - . In accordance with such an allocating method, a dispersion error in the constant electric currents of the constant electric current sources within one sample data is first immediately corrected. Namely, the constant electric current $i_1$ has a maximum negative error in an average value of the constant electric currents $i_1$ to $i_{16}$. The constant electric current $i_{16}$ has a maximum positive error in the average value of the constant electric currents $i_1$ to $i_{16}$. If these two constant electric currents $i_1$, $1_{16}$ are provided at continuous addresses, these errors can be canceled or minimized so that the dispersion error is immediately corrected.

The constant electric current $i_2$ is allocated to the next address to the constant electric current $i_{16}$ and has a second largest negative error in the average value of the constant electric currents $i_1$ to $i_{16}$. Accordingly, when the constant electric current $i_{16}$ is used as the constant electric current $i_2$, it can be also said that correcting effects of the error are considerably large. Similarly, since the sixteen constant electric currents are addressed, it can be said that this allocating method has large effects for immediately correcting the dispersion error in the constant electric currents of the constant electric current sources.

Further, the dispersion error in the constant electric currents of the constant electric current sources can be similarly easily corrected between sample data before and after. In other words, a correcting operation is performed such that conversion is performed by sixteen constant electric current sources each having the average value of the constant electric currents of the sixteen constant electric current sources as a constant electric current.

The results of simulations 7 and 8 in the embodiment in the adopting case of tables 1 and 3 in FIG. 9 shown in FIGS. 16 and 17 are respectively compared with the results of simulations 4 and 6 in the embodiment in the adopting case of tables 1 and 2 shown in FIGS. 13 and 15. In this comparison, with respect to the ratio S/(THD+N), it should be understood that the former is improved by about 5 dB in comparison with the latter. Further, with respect to the ratio S/N, it should be understood that the former is improved by about 8 dB in comparison with the latter.

Odd-numbered switching addresses are allocated to constant electric -currents $i_1$ to $i_8$ of the eight constant electric current sources $10_1$ to $10_8$ in the table 1 of FIG. 7, and even-numbered switching addresses are allocated to constant electric currents $i_9$ to $i_{16}$ of the remaining eight constant electric current sources $10_9$ to $10_{16}$ in this table 1. Otherwise, even-numbered switching addresses are allocated to the constant electric currents $i_1$ to $i_8$ of the eight constant electric current sources $10_1$ to $10_8$ in the table 1 of FIG. 7, and odd-numbered switching addresses are allocated to the constant electric currents $i_9$ to $i_{16}$ of the remaining eight constant electric current sources $10_9$ to $10_{16}$ in this table 1. If such allocating methods are used, there are correcting effects of the dispersion of the constant electric currents of the constant electric current sources although these effects are small in comparison with the allocating method of the table 3 of FIG. 9. Namely, the error in the average value of the constant electric currents of the sixteen constant electric current sources is caused on positive and negative sides at any time so that the constant electric currents are dispersed in a direction for reducing this error.

In the above-mentioned embodiment, input data of four bits are used as an example, but the number of bits of the input data is arbitrary.

In accordance with the above embodiment, a D/A converter has $2^N$ (here, N=2, 3, - - - ) constant electric current sources having constant electric current values equal to each other; selecting means for selecting Di constant electric current sources according to input data Di {here, Di=0, 1, 2, 3, - - - , $(2^N-1)$} having N-bits in input word length so as to use these $2^N$ constant electric current sources one by one until a sum of values of one input data or continuous plural input data among these $2^N$ constant electric current sources exceeds $2^N$; and electric current adding means for adding constant electric currents from the Di constant electric current sources selected by this selecting means to each other. Accordingly, even when the constant electric currents of the $2^N$ constant electric current sources are dispersed, it is possible to obtain a D/A converter in which the deterioration of a converting accuracy caused by this dispersion can be improved by 20 dB or more.

In accordance with the above embodiment, a D/A converter has $2^N$ (here, N=2, 3, - - - ) constant electric current sources having constant electric current values equal to each other; selecting means for selecting Di constant electric current sources according to input data Di {here, Di=0, 1, 2, 3, - - - , $(2^N-1)$} having N-bits in input word length so as to use these $2^N$ constant electric current sources one by one until a sum of values of one input data or continuous plural input data among these $2^N$ constant electric current sources exceeds $2^N$; and electric current adding means for adding each of the constant electric currents from the Di constant electric current sources selected by this selecting means to each other. Accordingly, even when the constant electric currents of the $2^N$ constant electric current sources are dispersed, it is possible to obtain a D/A converter in which an S/(THD+N) ratio is improved by about 5 dB and an S/N ratio is further improved by about 8 dB by allocating switching addresses on the basis of a dispersing tendency caused by a layout of the $2^N$ constant electric current sources when the D/A converter is formed in a semiconductor IC.

Further, it is possible to obtain a D/A converter in which the level of an ideal digital signal can be varied by changing time widths of deglitch signals DGL1, DGL2 without causing any requantizing noises and without any reduction in accuracy of digital data.

In accordance with a first construction of the present invention, a D/A converter comprises $2^N$ (here, N=2, 3, - - - ) constant electric current sources having constant electric current values equal to each other; selecting means for selecting Di constant electric current sources according to input data Di {here, Di=0, 1, 2, 3, - - - , $(2^N-1)$} having N-bits in input word length so as to use these $2^N$ constant electric current sources one by one until a sum of values of one input data or continuous plural input data among these $2^N$ constant electric current sources exceeds $2^N$; and electric current adding means for adding each of the constant electric currents from the Di constant electric current sources selected by this selecting means to each other. Accordingly, it is possible to obtain a D/A converter of a multibit type for improving its performance by reducing dispersion of the electric currents of the plural electric current sources as much as possible.

In accordance with a second construction of the present invention, a D/A converter comprises $2^N$ (here, N=2, 3, - - - ) constant electric current sources respectively having added addresses added and constant electric current values equal to each other; selecting means for selecting Di constant electric current sources according to input data Di {here, Di=0, 1, 2, 3, - - - , $(2^N-1)$} having N-bits in input word length so as to use these $2^N$ constant electric current sources one by one in accordance with an order of the addresses until a sum of values of one input data or continuous plural input data among these $2_N$ constant electric current sources exceeds $2^N$, and again use the $2^N$ constant electric current sources one by one in accordance with the order of the addresses every time the sum of values of the one input data or continuous plural input data exceeds $2^N$; and electric current adding means for adding each of the constant electric currents from the Di constant electric current sources selected by this selecting means to each other. Accordingly, it is possible to obtain a D/A converter of a multibit type for improving its performance by reducing dispersion of the electric currents of the plural electric current sources as much as possible.

In accordance with a third construction of the present invention, a D/A converter comprises $2^N$ (here, N=2, 3, - - - ) constant electric current sources respectively having addresses added and constant electric current values equal to each other switching means for outputting constant electric currents from constant electric current sources selected from these $2^N$ constant electric current sources; electric current adding means for adding the constant electric currents from the selected constant electric current sources outputted from the switching means; and switching signal generating means which has N-bit adding means supplied with input data Di and also has delay means for delaying an adding output of this N-bit adding means by one sample period and then supplying the delayed adding output to this N-bit adding means and adding the delayed adding output to the input data Di; the switching signal generating means detecting a final address of a switching signal previously used by one sample from this delay means; and the switching signal generating means generating a switching signal for controlling an operation of the switching means on the basis of the present sample data and this detected final address of the switching signal previously used by one sample such that constant electric currents are respectively outputted from Di constant electric current sources selected in accordance with input data Di {here, Di=0, 1, 2, 3, - - - , $(2^N-1)$} having N-bits in input word length so as to use these $2^N$ constant electric current sources one by one in accordance with an order of the addresses until a sum of values of one input data or continuous plural input data among the $2^N$ constant electric current sources exceeds $2^N$, and again use the $2^N$ constant electric current sources one by one in accordance with the order of the addresses every time the sum of values of the one input data or continuous plural input data exceeds $2^N$. Accordingly, it is possible to obtain a D/A converter of a multibit type for improving its performance by reducing dispersion of the electric currents of the plural electric current sources as much as possible.

In accordance with a fourth construction of the present invention, a D/A converter comprises $2^N$ (here, N=2, 3, - - - ) constant electric current sources respectively having added addresses added and constant electric current values equal to each other; switching means for outputting constant electric currents from constant electric current sources selected from these $2^N$ constant electric current sources; electric current adding means for adding the constant electric currents from the selected constant electric current sources outputted from this switching means;

and switching signal generating means which has N-bit adding means supplied with input data Di and also has delay means for delaying an adding output of this N-bit adding means by one sample period and then supplying the delayed adding output to this N-bit adding means and adding the delayed adding output to the input data Di;

the switching signal generating means further having data converting means for detecting a final address of a switching signal previously used by one sample from this delay means and constructed such that the present sample data and this detected final address of the switching signal previously used by one sample are supplied to the data converting means and data of N-bits are outputted;

and the switching signal generating means generating a switching signal for controlling an operation of the switching means on the basis of the data of N-bits from this data converting means and the input data Di of N-bits such that constant electric currents are respectively outputted from Di constant electric current sources in accordance with input data Di {here, Di=0, 1, 2, 3, - - - , $(2^N-1)$} having N-bits in input word length so as to use the $2^N$ constant electric current sources one by one in accordance with an order of the addresses until a sum of values of one input data or continuous plural input data among the $2^N$ constant electric current sources exceeds $2^N$, and again use the $2^N$ constant electric current sources one by one in accordance with the order of the addresses every time the sum of values of the one input data or continuous plural input data exceeds $2^N$. Accordingly, it is possible to obtain a D/A converter of a multibit type for improving its performance by reducing dispersion of the electric currents of the plural electric current sources as much as possible.

In accordance with a fifth construction of the present invention, a D/A converter comprises $2^N$ (here, N=2, 3, 4, - - - , $M=2^N$) constant electric current sources respectively having constant electric current values $i_1$, $i_2$, $i_3$, - - -, $i_M$ (here, $i_1<i_2<i_3<--- <i_M$) in which odd addresses are sequentially provided to constant electric current sources belonging to one group of a first group constructed by M/2 constant electric current sources having constant electric current values $i_1$, $i_2$, $i_3$, - - - , $i_{M/2}$, and a second group constructed by M/2 constant electric current sources having constant electric current values $i_{(M/2+1)}$, $i_{(M/2+2)}$, $i_{(M/2+3)}$, - - - , $i_M$, and even addresses are sequentially provided to constant electric current sources belonging to the other group; selecting means for selecting Di constant electric current sources according to input data Di {here, Di=0, 1, 2, 3, - - - , $(2^N-1)$} having N-bits in input word length so as to use these $2^N$ constant electric current sources one by one in accordance with an order of the addresses until a sum of values of one input data or continuous plural input data among these $2^N$ constant electric current sources exceeds $2^N$; and electric current adding means for adding each of constant electric currents from the Di constant electric current sources selected by the selecting means to each other. Accordingly, it is possible to obtain a D/A converter of a multibit type for improving its performance by reducing dispersion of the electric currents of the plural electric current sources as much as possible.

In accordance with a sixth construction of the present invention, a D/A converter comprises $2^N$ (here, N=2, 3, 4, - - - , $M=2^N$) constant electric current sources respectively having constant electric current values $i_1$, $i_2$, $i_3$, - - -, $i_M$ (here, $i_1<i_2<i_3<--- <i_M$) in which odd addresses are sequentially provided to constant electric current sources belonging to one group of a first group constructed by M/2 constant electric current sources having constant-electric current values $i_1$, $i_2$, $i_3$, - - - , $i_{M/2}$, and a second group constructed by M/2 constant electric current sources having constant electric current values $i_{(M/2+1)}$, $i_{(M/2+2)}$, $i_{(M/2+3)}$, - - - , $i_M$, and even addresses are sequentially provided to constant electric current sources belonging to the other group; selecting means for selecting Di constant electric current sources according to input data Di {here, Di=0, 1, 2, 3, - - - , $(2^N-1)$} having N-bits in input word length so as to use these $2^N$ constant electric current sources one by one in accordance with an order of the addresses until a sum of values of one input data or continuous plural input data among these $2^N$ constant electric current sources exceeds $2^N$, and again use the $2^N$ constant electric current sources one by one in accordance with the order of the addresses every time the sum of values of the one input data or continuous plural input data exceeds $2^N$; and electric current adding means for adding each of constant electric currents from the Di constant electric current sources selected by this selecting means to each other. Accordingly, it is possible to obtain a D/A converter of a multibit type for improving its performance by reducing dispersion of the electric currents of the plural electric current sources as much as possible.

In accordance with a seventh construction of the present invention, a D/A converter comprises $2^N$ (N=2, 3, 4, - - - , $M=2^N$) constant electric current sources respectively having constant electric current values $i_1$, $i_2$, $i_3$, - - - , $i_M$ (here, $i_1<i_2<i_3<--- <i_M$) in which addresses are provided to the constant electric current sources in an order of constant electric current values $i_1$, $i_M$, $i_2$, $i_{(M-1)}$, $i_3$, $i_{(M-2)}$, - - - , $i_{M/2}$, $i_{(M/2+1)}$; selecting means for selecting Di constant electric current sources according to input data Di {here, Di=0, 1, 2, 3, - - -, ($2^N$-1)} having N-bits in input word length so as to use these $2^N$ constant electric current sources one by one in accordance with an order of the addresses until a sum of values of one input data or continuous plural input data among these $2^N$ constant electric current sources exceeds $2^N$; and electric current adding means for adding each of constant electric currents from the Di constant electric current sources selected by the selecting means to each other. Accordingly, it is possible to obtain a D/A converter of a multibit type for improving its performance by reducing dispersion of the electric currents of the plural electric current sources as much as possible.

In accordance with an eighth construction of the present invention, a D/A converter comprises $2^N$ (N=2, 3, 4, - - -, M=$2^N$) constant electric current sources respectively having constant electric current values $i_1, i_2, i_3, - - -, i_M$ (here, $i_1<i_2<i_3<- - -<i_M$) in which addresses are provided to the constant electric current sources in an order of constant electric current values $i_1, i_M, 1_2, i_{(M-1)}, i_3, i_{(M-2)}, - - -, i_{M/2}, i_{(M/2+1)}$; selecting means for selecting Di constant electric current sources according to input data Di {here, Di=0, 1, 2, 3, - - -, ($2^N$-1)} having N-bits in input word length so as to use these $2^N$ constant electric current sources one by one in accordance with an order of the addresses until a sum of values of one input data or continuous plural input data among these $2^N$ constant electric current sources exceeds $2^N$, and again use the $2^N$ constant electric current sources one by one in accordance with the order of the addresses every time the sum of values of the one input data or continuous plural input data exceeds $2^N$; and electric current adding means for adding each of constant electric currents from the Di constant electric current sources selected by the selecting means to each other. Accordingly, it is possible to obtain a D/A converter of a multibit type for improving its performance by reducing dispersion of the electric currents of the plural electric current sources as much as possible.

In accordance with a ninth construction of the present invention, a D/A converter comprises $2^N$ (here, N=2, 3, - - - ) constant electric current sources having constant electric current values equal to each other; switching means constructed by $2^N$ first switching elements and $2^N$ second switching elements respectively connected to these $2^N$ constant electric current sources and controlled such that, when one switching elements of the first and second switching elements are turned on, the other switching elements are turned off; first and second electric current adding means for separately adding electric currents from the respective $2^N$ first and $2^N$ second switching elements of the switching means; and switching signal generating means for generating a switching signal for controlling an operation of each of the $2^N$ first switching elements such that constant electric currents are supplied to the first electric current adding means from Di constant electric current sources according to input data Di {here, Di=0, 1, 2, 3, - - -, ($2^N$-1)} having N-bits in input word length so as to use these $2^N$ constant electric current sources one by one until a sum of values of one input data or continuous plural input data among the $2^N$ constant electric current sources exceeds $2^N$; the switching signal generating means further generating a switching signal for controlling an operation of each of the $2^N$ second switching elements such that constant electric currents from the remaining ($2^N$-Di) constant electric current sources are supplied to the second electric current adding means. Accordingly, it is possible to obtain a D/A converter of a multibit type for improving its performance by reducing dispersion of the electric currents of the plural electric current sources as much as possible.

In accordance with a tenth construction of the present invention, a D/A converter comprises $2^N$ (here, N=2, 3, - - - ) constant electric current sources having constant electric current values equal to each other; switching means constructed by $2^N$ first switching elements and $2^N$ second switching elements respectively connected to these $2^N$ constant electric current sources and controlled such that, when one switching elements of the first and second switching elements are turned on, the other switching elements are turned off; first and second electric current adding means for separately adding electric currents from the respective $2^N$ first and second switching elements of the switching means; and switching signal generating means for generating a switching signal for controlling an operation of each of the $2^N$ first switching elements such that constant electric currents are supplied to the first electric current adding means from Di constant electric current sources according to input data Di {here, Di=0, 1, 2, 3, - - -, ($2^N$-1)} having N-bits in input word length so as to use these $2^N$ constant electric current sources one by one until a sum of values of one input data or continuous plural input data among the $2^N$ constant electric current sources exceeds $2^N$, and again use the $2^N$ constant electric current sources one by one in accordance with an order of addresses every time the sum of values of the one input data or continuous plural input data exceeds $2^N$; the switching signal generating means further generating a switching signal for controlling an operation of each of the $2^N$ second switching elements such that constant electric currents from the remaining ($2^N$-Di) constant electric current sources are supplied to the second electric current adding means. Accordingly, it is possible to obtain a D/A converter of a multibit type for improving its performance by reducing dispersion of the electric currents of the plural electric current sources as much as possible.

In accordance with an eleventh construction of the present invention, a D/A converter comprises $2^N$ (here, N=2, 3, - - - ) constant electric current sources having constant electric current values equal to each other; switching means constructed by $2^N$ first switching elements and $2^N$ second switching elements respectively connected to these $2^N$ constant electric current sources and controlled such that, when one switching elements of the first and second switching elements are turned on, the other switching elements are turned off; first and second electric current adding means for separately adding electric currents from the respective $2^N$ first and second switching elements of the switching means; and switching signal generating means which has N-bit adding means supplied input data Di and also has delay means for delaying an adding output of this N-bit adding means by one sample period and then supplying the delayed adding output to this N-bit adding means and adding the delayed adding output to the input data Di; the switching signal generating means detecting a final address of a switching signal previously used by one sample from this delay means; the switching signal generating means generating a switching signal for controlling an operation of each of the $2^N$ first switching elements on the basis of the present sample data and this detected final address of the switching signal previously used by one sample such that constant electric currents are respectively supplied to the first electric current adding means from Di constant electric current sources selected in accordance with input data Di {here, Di=0, 1, 2, 3, - - -, ($2^N$-1)} having N-bits in input word length so as to use these $2^N$ constant electric current sources one by one in accordance with an order of addresses until a sum of values of one input data or continuous plural input data among the $2^N$ constant electric current sources exceeds $2^N$, and again use the $2^N$ constant electric current sources one by one in accordance with the order of the addresses every time the sum of values of the one input data or continuous plural input data exceeds $2^N$; and the switching signal generating means further generating a switching signal for controlling an operation of each of the $2^N$ second switching elements such that constant electric currents from the remaining ($2^N$–Di) constant electric current sources are supplied to the second electric current adding means. Accordingly, it is possible to obtain a D/A converter of a multibit type for improving its performance by reducing dispersion of the electric currents of the plural electric current sources as much as possible.

In accordance with a twelfth construction of the present invention, a D/A converter comprises $2^N$ (here, N=2, 3, - - - ) constant electric current sources having constant electric current values equal to each other; switching means constructed by $2^N$ first switching elements and $2^N$ second switching elements respectively connected to these $2^N$ constant electric current sources and controlled such that, when one switching elements of the first and second switching elements are turned on, the other switching elements are turned off; first and second electric current adding means for separately adding electric currents from the respective $2^N$ first and second switching elements of the switching means; and switching signal generating means which has N-bit adding means supplied with input data Di and also has delay means for delaying an adding output of this N-bit adding means by one sample period and then supplying the delayed adding output to this N-bit adding means and adding the delayed adding output to the input data Di; the switching signal generating means further having data converting means for detecting a final address of a switching signal previously used by one sample from this delay means and constructed such that the present sample data and this detected final address of the switching signal previously used by one sample are supplied to the data converting means and data of N-bits are outputted; the switching signal generating means generating a switching signal for controlling an operation of each of the $2^N$ first switching elements on the basis of the data of N-bits from this data converting means such that constant electric currents are respectively supplied to the first electric current adding means from Di constant electric current sources selected in accordance with input data Di {here, Di=0, 1, 2, 3, - - - , ($2^N$–1)} having N-bits in input word length so as to use these $2^N$ constant electric current sources one by one in accordance with an order of addresses until a sum of values of one input data or continuous plural input data among the $2^N$ constant electric current sources exceeds $2^N$, and again use the $2^N$ constant electric current sources one by one in accordance with the order of the addresses every time the sum of values of the one input data or continuous plural input data exceeds $2^N$; and the switching signal generating means further generating a switching signal for controlling an operation of each of the $2^N$ second switching elements such that constant electric currents from the remaining ($2^N$–Di) constant electric current sources are supplied to the second electric current adding means. Accordingly, it is possible to obtain a D/A converter of a multibit type for improving its performance by reducing dispersion of the electric currents of the plural electric current sources as much as possible.

In accordance with a thirteenth construction of the present invention, a D/A converter comprises $2^N$ (here, N=2, 3, 4, - - - , M=$2^N$) constant electric current sources respectively having constant electric current values $i_1$, $i_2$, $i_3$, - - - , $i_M$ (here, $i_1<i_2<i_3<$- - - $<i_M$) in which odd addresses are sequentially provided to constant electric current sources belonging to one group of a first group constructed by M/2 constant electric current sources having constant electric current values $i_1$, $i_2$, $i_3$, - - - , $i_{M/2}$, and a second group constructed by M/2 constant electric current sources having constant electric current values $i_{(M/2+1)}$, $i_{(M/2+2)}$, $i_{(M/2+3)}$, - - - , $i_M$, and even addresses are sequentially provided to constant electric current sources belonging to the other group; switching means constructed by $2^N$ first switching elements and $2^N$ second switching elements respectively connected to these $2^N$ constant electric current sources and controlled such that, when one switching elements of the first and second switching elements are turned on, the other switching elements are turned off; first and second electric current adding means for separately adding electric currents from the respective $2^N$ first and second switching elements of the switching means; and switching signal generating means for generating a switching signal for controlling an operation of each of the $2^N$ first switching elements such that constant electric currents are supplied to the first electric current adding means from Di constant electric current sources according to input data Di {here, Di=0, 1, 2, 3, - - - , ($2^N$–1)} having N-bits in input word length so as to use these $2^N$ constant electric current sources one by one in accordance with an order of the addresses until a sum of values of one input data or continuous plural input data among the $2^N$ constant electric current sources exceeds $2^N$; the switching signal generating means further generating a switching signal for controlling an operation of each of the $2^N$ second switching elements such that constant electric currents from the remaining ($2^N$–Di) constant electric current sources are supplied to the second electric current adding means. Accordingly, it is possible to obtain a D/A converter of a multibit type for improving its performance by reducing dispersion of the electric currents of the plural electric current sources as much as possible.

In accordance with a fourteenth construction of the present invention, a D/A converter comprises $2^N$ (here, N=2, 3, 4, - - - , M=$2^N$) constant electric current sources respectively having constant electric current values $i_1$, $i_2$, $i_3$, - - - , $i_M$ (here, $i_1<i_2<i_3<$- - - $<i_M$) in which odd addresses are sequentially provided to constant electric current sources belonging to one group of a first group constructed by M/2 constant electric current sources having constant electric current values $i_1$, $i_2$, $i_3$, - - - , $i_{M/2}$, and a second group constructed by M/2 constant electric current sources having constant electric current values $i_{(M/2+1)}$, $i_{(M/2+2)}$, $i_{(M/2+3)}$, - - - , $i_M$, and even addresses are sequentially provided to constant electric current sources belonging to the other group; switching means constructed by $2^N$ first switching elements and $2^N$ second switching elements respectively connected to these $2^N$ constant electric current sources and controlled such that, when first switching elements of the first and second switching elements are turned on, the other switching elements are turned off; first and second electric current adding means for separately adding electric currents from the respective $2^N$ first and second switching elements of the switching means; and switching signal generating means for generating a switching signal for controlling an operation of each of the $2^N$ first switching elements such that constant electric currents are supplied to the first electric current adding means from Di constant electric current sources according to input data Di {here, Di=0, 1, 2, 3, - - - , ($2^N$–1)} having N-bits in input word length so as to use these $2^N$ constant electric current sources one by one in accordance with an order of the addresses until a sum of values of one input data or continuous plural input data among the $2^N$ constant electric current sources exceeds $2^N$, and again use the $2^N$ constant electric current sources one by one in accordance with the order of the addresses every time the sum of values of the one input data or continuous plural input data exceeds $2^N$; the switching signal generating means further generating a switching signal for controlling an operation of each of the $2^N$ second switching elements such that constant electric currents from the remaining $(2^N-Di)$ constant electric current sources are supplied to the second electric current adding means. Accordingly, it is possible to obtain a D/A converter of a multibit type for improving its performance by reducing dispersion of the electric currents of the plural electric current sources as much as possible.

In accordance with a fifteenth construction of the present invention, a D/A converter comprises $2^N$ (N=2, 3, 4, - - - , M=$2^N$) constant electric current sources respectively having constant electric current values $i_1$, $i_2$, $i_3$, - - - , $i_M$ (here, $i_1<i_2<i_3<$ - - - $<i_M$) in which addresses are provided to the constant electric current sources in an order of constant electric current values $i_1$, $i_M$, $i_2$, $i_{(M-1)}$, $i_3$, $i_{(M-2)}$, - - - , $i_{M/2}$, $i_{(M/2+1)}$; switching means constructed by $2^N$ first switching elements and $2^N$ second switching elements respectively connected to these $2^N$ constant electric current sources and controlled such that, when first switching elements of the first and second switching elements are turned on, the other switching elements are turned off; first and second electric current adding means for separately adding electric currents from the respective $2^N$ first and second switching elements of the switching means; and switching signal generating means for generating a switching signal for controlling an operation of each of the $2^N$ first switching elements such that constant electric currents are supplied to the first electric current adding means from Di constant electric current sources according to input data Di {here, Di=0, 1, 2, 3, - - -, $(2^N-1)$} having N-bits in input word length so as to use these $2^N$ constant electric current sources one by one in accordance with the order of the addresses until a sum of values of one input data or continuous plural input data among the $2^N$ constant electric current sources exceeds $2^N$; the switching signal generating means further generating a switching signal for controlling an operation of each of the $2^N$ second switching elements such that constant electric currents from the remaining $(2^N-Di)$ constant electric current sources are supplied to the second electric current adding means. Accordingly, it is possible to obtain a D/A converter of a multibit type for improving its performance by reducing dispersion of the electric currents of the plural electric current sources as much as possible.

In accordance with a sixteenth construction of the present invention, a D/A converter comprises $2^N$ (N=2, 3, 4, - - -, M=$2^N$) constant electric current sources respectively having constant electric current values $i_1$, $i_2$, $i_3$, - - - , $i_M$ (here, $i_1<i_2<i_3<$ - - - $<i_M$) in which addresses are provided to the constant electric current sources in an order of constant electric current values $i_1$, $i_M$, $i_2$, $i_{(M-1)}$, $i_3$, $i_{(M-2)}$, - - - , $i_{M/2}$, $i_{(M/2+1)}$; switching means constructed by $2^N$ first switching elements and $2^N$ second switching elements respectively connected to these $2^N$ constant electric current sources and controlled such that, when first switching elements of the first and second switching elements are turned on, the other switching elements are turned off; first and second electric current adding means for separately adding electric currents from the respective $2^N$ first and second switching elements of the switching means; and switching signal generating means for generating a switching signal for controlling an operation of each of the $2^N$ first switching elements such that constant electric currents are supplied to the first electric current adding means from Di constant electric current sources according to input data Di {here, Di=0, 1, 2, 3, - - -, $(2^N-1)$} having N-bits in input word length so as to use these $2^N$ constant electric current sources one by one in accordance with an order of the addresses until a sum of values of one input data or continuous plural input data among these $2^N$ constant electric current sources exceeds $2^N$, and again use the $2^N$ constant electric current sources one by one in accordance with the order of the addresses every time the sum of values of the one input data or continuous plural input data exceeds $2^N$; the switching signal generating means further generating a switching signal for controlling an operation of each of the $2^N$ second switching elements such that constant electric currents from the remaining $(2^N-Di)$ constant electric current sources are supplied to the second electric current adding means. Accordingly, it is possible to obtain a D/A converter of a multibit type for improving its performance by reducing dispersion of the electric currents of the plural electric current sources as much as possible.

In accordance with a seventeenth construction of the present invention, a D/A converter comprises $2^N$ (here, N=2, 3, - - - ) constant electric current sources having constant electric current values equal to each other; switching means constructed by $2^N$ first switching elements and $2^N$ second switching elements respectively connected to these $2^N$ constant electric current sources and controlled such that, when first switching elements of the first and second switching elements are turned on, the other switching elements are turned off; deglitch means which is constructed by third and fourth switching elements for switching adding outputs of electric currents from the respective $2^N$ first switching elements of this switching means and is also constructed by fifth and sixth switching elements for switching adding outputs of electric currents from the respective $2^N$ second switching elements of the switching means; switching signal generating means for generating $2^N$ first switching signals for controlling operations of the $2^N$ first switching elements such that constant electric currents are supplied to the third and fourth switching elements from Di constant electric current sources according to input data Di {here, Di=0, 1, 2, 3, - - -, $(2^N-1)$} having N-bits in input word length so as to use these $2^N$ constant electric current sources one by one until a sum of values of one input data or continuous plural input data among the $2^N$ constant electric current sources exceeds $2^N$; the switching signal generating means further generating $2^N$ second switching signals which have phases reverse to those of the $2^N$ first switching signals and control operations of the $2^N$ second switching elements such that constant electric currents from the remaining $(2^N-Di)$ constant electric current sources are supplied to the fifth and sixth switching elements; and deglitch signal generating means for generating a first deglitch signal for turning-off the third and fifth switching elements every first predetermined period including changing points of the respective $2^N$ first and second switching signals, and turning-on the third and fifth switching elements in a second predetermined period not including the first predetermined period the deglitch signal generating means further generating a second deglitch signal for turning-on the fourth and sixth switching elements every first predetermined period including the changing points of the respective $2^N$ first and second switching signals, and turning-off the fourth and sixth switching elements in the second predetermined period. Accordingly, it is possible to obtain a D/A converter of a multibit type for improving its performance by reducing dispersion of the electric currents of the plural electric current sources as much as possible, and reducing an influence of glitches caused by dispersion of the switching timings of plural electric current switches corresponding to the plural electric current sources as much as possible.

In accordance with an eighteenth construction of the present invention, a D/A converter comprises $2^N$ (here, N=2, 3, - - - ) constant electric current sources having constant electric current values equal to each other; switching means constructed by $2^N$ first switching elements and $2^N$ second switching elements respectively connected to these $2^N$ constant electric current sources and controlled such that, when first switching elements of the first and second switching elements are turned on, the other switching elements are turned off; deglitch means which is constructed by third and fourth switching elements for switching adding outputs of electric currents from the respective $2^N$ first switching elements of this switching means and is also constructed by fifth and sixth switching elements for switching adding outputs of electric currents from the respective $2^N$ second switching elements of the switching means; switching signal generating means for generating $2^N$ first switching signals for controlling operations of the $2^N$ first switching elements such that constant electric currents are supplied to the third and fourth switching elements from Di constant electric current sources according to input data Di {here, Di=0, 1, 2, 3, - - -, $(2^N-1)$} having N-bits in input word length so as to use these $2^N$ constant electric current sources one by one until a sum of values of one input data or continuous plural input data among the $2^N$ constant electric current sources exceeds $2^N$, and again use the $2^N$ constant electric current sources one by one in accordance with an order of addresses every time the sum of values of the one input data or continuous plural input data exceeds $2^N$; the switching signal generating means further generating $2^N$ second switching signals for controlling operations of the $2^N$ second switching elements such that constant electric currents from the remaining $(2^N-Di)$ constant electric current sources are supplied to the fifth and sixth switching elements; and deglitch signal generating means for generating a first deglitch signal for turning-off the third and fifth switching elements every first predetermined period including changing points of the respective $2^N$ first and second switching signals, and turning-on the third and fifth switching elements in a second predetermined period not including the first predetermined period; the deglitch signal generating means further generating a second deglitch signal for turning-on the fourth and sixth switching elements every first predetermined period including the changing points of the respective $2^N$ first and second switching signals, and turning-off the fourth and sixth switching elements in the second predetermined period. Accordingly, it is possible to obtain a D/A converter of a multibit type for improving its performance by reducing dispersion of the electric currents of the plural electric current sources as much as possible, and reducing an influence of glitches caused by dispersion of the switching timings of plural electric current switches corresponding to the plural electric current sources as much as possible.

In accordance with a nineteenth construction of the present invention, a D/A converter comprises $2^N$ (here, N=2, 3, 4, - - -, $M=2^N$) constant electric current sources respectively having constant electric current values $i_1, i_2, i_3, - - -, i_M$ (here, $i_1<i_2<i_3<- - -<i_M$) in which odd addresses are sequentially provided to constant electric current sources belonging to one group of a first group constructed by M/2 constant electric current sources having constant electric current values $i_1, i_2, i_3, - - -, i_{M/2}$, and a second group constructed by M/2 constant electric current sources having constant electric current values $i_{(M/2+1)}, i_{(M/2+2)}, i_{(M/2+3)}, - - -, i_M$, and even addresses are sequentially provided to constant electric current sources belonging to the other group; switching means constructed by $2^N$ first switching elements and $2^N$ second switching elements respectively connected to these $2^N$ constant electric current sources and controlled such that, when first switching elements of the first and second switching elements are turned on, the other switching elements are turned off; deglitch means which is constructed by third and fourth switching elements for switching adding outputs of electric currents from the respective $2^N$ first switching elements of this switching means and is also constructed by fifth and sixth switching elements for switching adding outputs of electric currents from the respective $2^N$ second switching elements of the switching means; switching signal generating means for generating $2^N$ first switching signals for controlling operations of the $2^N$ first switching elements such that constant electric currents are supplied to the third and fourth switching elements from Di constant electric current sources according to input data Di {here, Di=0, 1, 2, 3, - - -, $(2^N-1)$} having N-bits in input word length so as to use these $2^N$ constant electric current sources one by one in accordance with an order of the addresses until a sum of values of one input data or continuous plural input data among the $2^N$ constant electric current sources exceeds $2^N$; the switching signal generating means further generating switching signals for controlling operations of the $2^N$ second switching elements such that constant electric currents from the remaining $(2^N-Di)$ constant electric current sources are supplied to the fifth and sixth switching elements; and deglitch signal generating means for generating a first deglitch signal for turning-off the third and fifth switching elements every first predetermined period including changing points of the respective $2^N$ first and second switching signals, and turning-on the third and fifth switching elements in a second predetermined period not including the first predetermined period; the deglitch signal generating means further generating a second deglitch signal for turning-on the fourth and sixth switching elements every first predetermined period including the changing points of the respective $2^N$ first and second switching signals, and turning-off the fourth and sixth switching elements in the second predetermined period. Accordingly, it is possible to obtain a D/A converter of a multibit type for improving its performance by reducing dispersion of the electric currents of the plural electric current sources as much as possible, and reducing an influence of glitches caused by dispersion of the switching timings of plural electric current switches corresponding to the plural electric current sources as much as possible.

In accordance with a twentieth construction of the present invention, a D/A converter comprises $2^N$ (here, N=2, 3, 4, - - -, $M=2^N$) constant electric current sources respectively having constant electric current values $i_1, i_2, i_3, - - -, i_M$ (here, $i_1<i_2<i_3<- - -<i_M$) in which odd addresses are sequentially provided to constant electric current sources belonging to one group of a first group constructed by M/2 constant electric current sources having constant electric current values $i_1, i_2, i_3, - - -, i_{M/2}$, and a second group constructed by M/2 constant electric current sources having constant electric current values $i_{(M/2+1)}, i_{(M/2+2)}, i_{(M/2+3)}, - - -, i_M$, and even addresses are sequentially provided to constant electric current sources belonging to the other group; switching means constructed by $2^N$ first switching elements and $2^N$ second switching elements respectively connected to these $2^N$ constant electric current sources and controlled such that, when one switching elements of the first and second switching elements are turned on, the other switching elements are turned off; deglitch means which is constructed by third and fourth switching elements for switching adding outputs of electric currents from the respective $2^N$ first switching elements of this switching means and is also constructed by fifth and sixth switching elements for switching adding outputs of electric currents from the respective $2^N$ second switching elements of the switching means; switching signal generating means for generating $2^N$ first switching signals for controlling operations of the $2^N$ first switching elements such that constant electric currents are supplied to the third and fourth switching elements from Di constant electric current sources according to input data Di {here, Di=0, 1, 2, 3, - - -, $(2^N-1)$} having N-bits in input word length so as to use these $2^N$ constant electric current sources one by one in accordance with an order of the addresses until a sum of values of one input data or continuous plural input data among the $2^N$ constant electric current sources exceeds $2^N$, and again use the $2^N$ constant electric current sources one by one in accordance with the order of the addresses every time the sum of values of the one input data or continuous plural input data exceeds $2^N$; the switching signal generating means further generating $2^N$ second switching signals for controlling operations of the $2^N$ second switching elements such that constant electric currents from the remaining $(2^N-Di)$ constant electric current sources are supplied to the fifth and sixth switching elements; and deglitch signal generating means for generating a first deglitch signal for turning-off the third and fifth switching elements every first predetermined period including changing points of the respective $2^N$ first and second switching signals, and turning-on the third and fifth switching elements in a second predetermined period not including the first predetermined period; the deglitch signal generating means further generating a second deglitch signal for turning-on the fourth and sixth switching elements every first predetermined period including the changing points of the respective $2^N$ first and second switching signals, and turning-off the fourth and sixth switching elements in the second predetermined period. Accordingly, it is possible to obtain a D/A converter of a multibit type for improving its performance by reducing dispersion of the electric currents of the plural electric current sources as much as possible, and reducing an influence of glitches caused by dispersion of the switching timings of plural electric current switches corresponding to the plural electric current sources as much as possible.

In accordance with a twenty-first construction of the present invention, a D/A converter comprises $2^N$ (N=2, 3, 4, - - -, $M=2^N$) constant electric current sources respectively having constant electric current values $i_1, i_2, i_3, - - -, i_M$ (here, $i_1<i_2<i_3<- - -<i_M$) in which addresses are provided to the constant electric current sources in an order of constant electric current values $i_1, i_M, i_2, i_{(M-1)}, i_3, i_{(M-2)}, - - -, i_{M/2}, i_{(M/2+1)}$; switching means constructed by $2^N$ first switching elements and $2^N$ second switching elements respectively connected to these $2^N$ constant electric current sources and controlled such that, when first switching elements of the first and second switching elements are turned on, the other switching elements are turned off; deglitch means which is constructed by third and fourth switching elements for switching adding outputs of electric currents from the respective $2^N$ first switching elements of this switching means and is also constructed by fifth and sixth switching elements for switching adding outputs of electric currents from the respective $2^N$ second switching elements of the switching means; switching signal generating means for generating $2^N$ first switching signals for controlling operations of the $2^N$ first switching elements such that constant electric currents are supplied to the third and fourth switching elements from Di constant electric current sources according to input data Di {here, Di=0, 1, 2, 3, - - -, $(2^N-1)$} having N-bits in input word length so as to use these $2^N$ constant electric current sources one by one in accordance with an order of the addresses until a sum of values of one input data or continuous plural input data among the $2^N$ constant electric current sources exceeds $2^N$; the switching signal generating means further generating $2^N$ second switching signals for controlling operations of the $2^N$ second switching elements such that constant electric currents from the remaining $(2^N-Di)$ constant electric current sources are supplied to the fifth and sixth switching elements; and deglitch signal generating means for generating a first deglitch signal for turning-off the third and fifth switching elements every first predetermined period including changing points of the respective $2^N$ first and second switching signals, and turning-on the third and fifth switching elements in a second predetermined period not including the first predetermined period; the deglitch signal generating means further generating a second deglitch signal for turning-on the fourth and sixth switching elements every first predetermined period including the changing points of the respective $2^N$ first and second switching signals, and turning-off the fourth and sixth switching elements in the second predetermined period. Accordingly, it is possible to obtain a D/A converter of a multibit type for improving its performance by reducing dispersion of the electric currents of the plural electric current sources as much as possible, and reducing an influence of glitches caused by dispersion of the switching timings of plural electric current switches corresponding to the plural electric current sources as much as possible.

In accordance with a twenty-second construction of the present invention, a D/A converter comprises $2^N$ (N=2, 3, 4, - - -, $M=2^N$) constant electric current sources respectively having constant electric current values $i_1, i_2, i_3, - - -, i_M$ (here, $i_1<i_2<i_3<- - -<i_M$) in which addresses are provided to the constant electric current sources in an order of constant electric current values $i_1, i^M, i_2, i_{(M-1)}, i_3, i_{(M-2)}, - - -, i_{M/2}, i_{(M/2+1)}$; switching means constructed by $2^N$ first switching elements and $2^N$ second switching elements respectively connected to these $2^N$ constant electric current sources and controlled such that, when first switching elements of the first and second switching elements are turned on, the other switching elements are turned off; deglitch means which is constructed by third and fourth switching elements for switching adding outputs of electric currents from the respective $2^N$ first switching elements of this switching means and is also constructed by fifth and sixth switching elements for switching adding outputs of electric currents from the respective $2^N$ second switching elements of the switching means; switching signal generating means for generating $2^N$ first switching signals for controlling operations of the $2^N$ first switching elements such that constant electric currents are supplied to the third and fourth switching elements from Di constant electric current sources according to input data Di {here, Di=0, 1, 2, 3, - - -, $(2^N-1)$} having N-bits in input word length so as to use these $2^N$ constant electric current sources one by one in accordance with an order of the addresses until a sum of values of one input data or continuous plural input data among these $2^N$ constant electric current sources exceeds $2^N$, and again use the $2^N$ constant electric current sources one by one in accordance with the order of the addresses every time the sum of values of the one input data or continuous plural input data exceeds $2^N$; the switching signal generating means further generating $2^N$ second switching signals for controlling operations of the $2^N$ second switching elements such that constant electric currents from the remaining ($2^N$–Di) constant electric current sources are supplied to the fifth and sixth switching elements; and deglitch signal generating means for generating a first deglitch signal for turning-off the third and fifth switching elements every first predetermined period including changing points of the respective $2^N$ first and second switching signals, and turning-on the third and fifth switching elements in a second predetermined period not including the first predetermined period; the deglitch signal generating means further generating a second deglitch signal for turning-on the fourth and sixth switching elements every first predetermined period including the changing points of the respective $2^N$ first and second switching signals, and turning-off the fourth and sixth switching elements in the second predetermined period. Accordingly, it is possible to obtain a D/A converter of a multibit type for improving its performance by reducing dispersion of the electric currents of the plural electric current sources as much as possible, and reducing an influence of glitches caused by dispersion of the switching timings of plural electric current switches corresponding to the plural electric current sources as much as possible.

In accordance with twenty-third to twenty-eighth constructions of the present invention, time width variable means for changing time widths of the first and second deglitch signals is arranged in the D/A converters of the seventeenth to twenty-second constructions of the present invention. Accordingly, in addition to the effects of the twenty-third to twenty-eighth constructions of the present invention, the level of an ideal digital signal can be varied without causing any requantizing noises and any reduction in accuracy of digital data. The requantizing noises are caused in the case of a volume function in which conventional input digital data and digital volume data are multiplied.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A D/A converter comprising:
    $2^N$ (here, N=2, 3, - - - ) constant electric current sources having addresses and having respective constant electric current values equal to each other;
    switching means for outputting constant electric currents from selected constant electric current sources selected from the $2^N$ constant electric current sources;
    electric current adding means for adding the constant electric currents from said selected constant electric current sources outputted from the switching means; and
    switching signal generating means having N-bit adding means supplied with input data Di and delay means for delaying an adding output of the N-bit adding means by one sample period and for supplying a delayed adding output to the N-bit adding means and adding the delayed adding output to said input data Di, for generating a switching signal to control said switching means such that a final address of a switching signal previously delayed by one sample from the delay means is detected and, on the basis of the present sample data and a detected final address of the switching signal previously delayed by one sample, respective constant electric currents are outputted from Di ones of the $2^N$ constant electric current sources selected in accordance with input data DI {here, Di=0, 1, 2, 3, - - - ($2^N$–1)} having N-bits in input word length so as to use the $2^N$ constant electric current sources one by one in accordance with an order of said addresses until a sum of values of one of the input data or a continuous plurality of the input data among said $2^N$ constant electric current sources exceeds $2^N$, and then to again use said $2^N$ constant electric current sources one by one in accordance with an order to said addresses every time a sum of values of said one input data or said continuous plurality of the input data exceeds $2^N$.

2. A D/A converter comprising:
    $2^N$ (here, N=2, 3, - - - ) constant electric current sources having addresses and having respective constant electric current values equal to each other;
    switching means for outputting constant electric currents from selected constant electric current sources selected from the $2^N$ constant electric current sources;
    electric current adding means for adding constant electric currents from said selected constant electric current sources outputted from the switching means; and
    switching signal generating means having N-bit adding means supplied with input data Di, delay means for delaying an adding output of the N-bit adding by one sample period and for supplying a delayed adding output to the N-bit adding means and adding the delayed adding output to said input data Di, and data converting means for detecting a final address of a switching signal previously used by one sample from the delay means and supplied with present sample data and the detected final address of the switching signal previously used by one sample N-bits, and for generating a switching signal for controlling an operation of said switching means on the basis that constant electric currents are respectively outputted from Di ones of the constant electric current sources in accordance with said input data Di {here, Di=0, 1, 2, 3, - - - , ($2^N$–1) } having N-bits in input word length so as to first use the $2^N$ constant electric current sources one by one in accordance with an order of said addresses until a sum of values of one of the input data or a continuous plurality of the input data among said $2^N$ constant electric current sources exceeds $2^N$, and then to again use said $2^N$ constant electric current sources one by one in accordance with an order of said addresses every time a sum of values of said one input data of said continuous plurality of said input data exceeds $2^N$.

3. A digital-to-analog converter comprising:
    oversampling means for converting an inputted first multi-bit digital audio signal which is sampled by a first sampling frequency to a second multibit digital audio signal which is sampled by a second sampling frequency greater than the first sampling frequency;
    noise shaping means for quantizing the second multi-bit digital audio signal to a third multibit digital audio signal that has less bits than the first multibit digital audio signal;
    pulse width modulation means for modulating the third multibit digital audio signal;
    wherein the pulse width modulation means comprises:
        (a) $2^N$ (N=2, 3, . . . ) constant electric current sources through which are flowed substantially equal constant electric current values;

(b) $2^N$ switching means including a pair of differential switching elements connected to each of the $2^N$ constant current sources, respectively;

(c) switching address generating means for generating $2^N$ switching addresses in accordance with the third multibit digital audio signal and a final address among n continuous switching addresses (n=2, 3, . . . ) used in data previously generated by one sample; and (d) adding means for adding output signals from each pair of differential switching elements.

* * * * *